United States Patent [19]
Krishna et al.

[11] Patent Number: 5,668,734
[45] Date of Patent: Sep. 16, 1997

[54] METHOD FOR ANALYZING 2D TRANSFERRED NOESY SPECTRA OF MOLECULES UNDERGOING MULTISTATE CONFORMATIONAL EXCHANGE

[75] Inventors: Nepalli Rama Krishna, Birmingham; Hunter N. B. Moseley, Hoover, both of Ala.

[73] Assignee: The UAB Research Foundation, Birmingham, Ala.

[21] Appl. No.: 420,846

[22] Filed: Apr. 10, 1995

[51] Int. Cl.$^6$ .......................... G01N 24/08; G06F 17/16
[52] U.S. Cl. ...................... 364/497; 324/300; 324/307; 324/316; 436/173
[58] Field of Search .................... 324/300, 307, 324/309, 312, 316; 364/496, 497, 498; 436/173

[56] References Cited

U.S. PATENT DOCUMENTS

| | | | |
|---|---|---|---|
| Re. 32,619 | 3/1988 | Damadian | 324/309 X |
| Re. 32,689 | 6/1988 | Damadian | 324/309 X |
| 4,354,499 | 10/1982 | Damadian | 324/309 X |
| 4,411,270 | 10/1983 | Damadian | 324/309 X |
| 4,510,449 | 4/1985 | Ernst et al. | 324/309 |
| 4,558,279 | 12/1985 | Ackerman et al. | 436/173 X |
| 4,774,467 | 9/1988 | Sorensen | 324/311 |
| 4,980,640 | 12/1990 | Van Ormondt et al. | 324/307 |
| 4,984,574 | 1/1991 | Goldberg et al. | 128/653 A |
| 5,117,186 | 5/1992 | Burum et al. | 324/307 |
| 5,189,370 | 2/1993 | Kolem et al. | 324/309 |
| 5,254,460 | 10/1993 | Josephson et al. | 435/7.25 |
| 5,285,156 | 2/1994 | Bodenhausen et al. | 324/307 |

OTHER PUBLICATIONS

Complete Relaxation and Conformational Exchange Matrix (CORCEMA) Analysis of NOESY Spectra of Interacting Systems; Two–Dimensional Transferred NOESY, Hunter N. B. Moseley et al., Journal of Magnetic Resonance, Series B 108, 243–261 (1995).

Application of crystallographic and modeling methods in the design of purine nucleoside phosphorylase inhibitors, Steven E. Ealick et al., Proc. Natl. Acad. Sci. USA, vol. 88, pp. 11540–11544, Dec. 1991.

Induced–fit Movements in Adenylate Kinases, Georg E. Schulz et al., Mol. Biol. (1990) 213, 627–630.

Effect of Slow Conformational Exchange on the 2D–NOESY Spectra of Biomolecules, N. Rama Krishna et al., Biophysical Journal 61, A33 (1992).

Protein solution structure determination using distances from two–dimensional nuclear Overhauser effect experiments: Effect of approximations on the accuracy of derived structures, Paul D. Thomas et al., Proc. Natl. Acad. Sci. USA, vol. 88, pp. 1237–1241, Feb. 1991.

Two–dimensional NMR investigations of the interactions of antibodies with peptide antigens, Jacob Anglister et al., The FASEB Journal, vol. 7, pp. 1154–1162, Sep. 1993.

Solution Conformation of Peptides by the Intramolecular Nuclear Overhauser Effect Experiment, N. R. Krishna et al., Biophysical Journal, vol. 24, pp. 791–814, Dec. 1978.

(List continued on next page.)

*Primary Examiner*—Edward R. Cosimano
*Attorney, Agent, or Firm*—Gifford, Krass, Groh, Sprinkle, Patmore, Anderson & Citkowski, P.C.

[57] ABSTRACT

Disclosed is a method of determining two-dimensional nuclear- or rotating frame-Overhauser effect spectroscopy intensities for a ligand-enzyme system having flexible active cites, wherein the ligand-enzyme system has at least 3 conformational states. The first step is inputing data into a modeling computer of coordinates for each molecule on the enzyme and ligand, kinetic data, correlation times, and concentrations of ligand and enzyme. Next, a K matrix is created from the kinetic data, and an an R matrix is derived from the correlation times and the coordinates. A dynamic matrix D is created by summing the K and R matrices. This D matrix is symmetrized and diagonalized. Spectroscopy intensities are then derived from the symmetrized and diagonalized D matrix.

14 Claims, 16 Drawing Sheets

OTHER PUBLICATIONS

A General Multistate Model for the Analysis of Hydrogen–Exchange Kinetics, N. Rama Krishna et al., Biopolymers, vol. 19, 2003–2020 (1980).

Application of a Theory of Enzyme Specificity to Protein Synthesis, D. E. Koshland, Jr., Symposium, vol. 44, pp. 98–104 (1958).

Glucose–induced conformational change in yeast hexokinase, William S. Bennett, Jr. et al., Proc. Natl. Acad. Sci. USA, vol. 75, No. 10, pp. 4848–4852, Oct. 1978.

Conformation of acetylcholine bound to the nicrotinic acetylcholine receptor, Ronald W. Behling et al., Proc. Natl. Acad. Sci. USA, vol. 85, pp. 6721–6725, Sep. 1988.

A computationally efficient method for evaluating the gradient of 2D NOESY intensities, Ping F. Yip, Journal of Biomolecular NMR, 3 (1993) 361–365.

A New Method for Refinement of Macromolecular Structures Based on Nuclear Overhauser Effect Spectra, Ping Yip et al., Journal of Magnetic Resonance 83, 643–648 (1989).

Myosin Catalytic Domain Flexibility in MgADP, Dražen Raucher et al., Biochemistry 1994, 33, 14317–14323.

Distance Distributions in Proteins Recovered by Using Frequency–Domain Fluorometry. Applications to Troponin I and Its Complex with Troponin C, Joseph R. Lakowicz et al., Biochemistry 1988, 27, 9149–9160.

Direct Observation of Enzyme Activity with the Atomic Force Microscope, Manfred Radmacher et al., Science, vol. 265, pp. 1577–1579, Sep. 9, 1994.

Isotope–Filtered 2D NMR of a Protein–Peptide Complex: Study of a Skeletal Muscle Myosin Light Chain Kinase Fragment Bound to Calmodulin, Mitsuhiko Ikura et al., J. Am. Chem. Soc. 1992, 114, 2433–2440.

An Improved Method for Selectively Observing Protons Attached to $^{12}C$ in the Presence of $^{1}H$–$^{13}C$ Spin Pairs, Gerd Gemmecker et al., Journal of Magnetic Resonance 96, 199–204 (1992).

Two–Dimensional Transferred Nuclear Overhauser Effect Spectroscopy Study of the Conformation of MgATP Bound at the Active and Ancillary Sites of Rabbit Muscle Pyruvate Kinase, Gotam K. Jarori et al., Biochemistry 1994, 33, 6784–6791.

Studies of Inhibitor Binding to *Escherichia coli* Purine Nucleoside Phosphorylase Using the Transferred Nuclear Overhauser Effect and Rotating–Frame Overhauser Enhancement, Michael E. Perlman et al., Biochemistry 1994, 33, 7547–7559.

Anatomy of a Conformational Change: Hinged "Lid" Motion of the Triosephosphate Isomerase Loop, Diane Joseph et al., Science, vol. 249, pp. 1425–1428, Sep. 21, 1990.

Atomic structures and function of periplasmic receptors for active transport and chemotaxis, Florante A. Quiocho, Current Opinion in Structural Biology 1991, 1:922–933.

Two–Dimensional Transferred Nulcear–Overhauser Effects with Incomplete Averaging of Free–and Bound–Ligand Resonances, Feng Ni, Journal of Magnetic Resonance, Series B 106, 147–155 (1995).

Spin Relaxation Processes in a Two–Proton System Undergoing Anisotropic Reorientation, D. E. Woessner, The Journal of Chemical Physics, vol. 36, No. 1, pp. 1–4, Jan. 1, 1962.

Relative Effects of Protein–Mediated and Ligand–Mediated Spin–Diffusion Pathways on Transferred NOESY, and Implications on the Accuracy of the Bound Ligand Conformation, Patricia L. Jackson et al., Journal of Magnetic Resonance, Series B 107, 289–292 (1995).

Complete relaxation matrix refinement of NMR structures of proteins using analytically calculated dihedral angle derivatives of NOE intensities, John E. Mertz et al., Journal of Biomolecular NMR, 1 (1991) 257–269.

Recent Developments in Transferred NOE Methods, Feng Ni, Progress in NMR Spectroscopy, vol. 26, pp. 517–606 (1994).

Theory and Experimental Results of Transfer–NOE Experiments. 1. The Influence of the Off Rate versus Cross–Relaxation Rates, G. M. Lippens et al., Journal of Magnetic Resonance 99, 268–281 (1992).

Relaxation–Matrix Analysis of the Transferred Nuclear Overhauser Effect for Finite Exchange Rates, Robert E. London et al., Journal of Magnetic Resonance 97, 79–98 (1992).

Complete Relaxation Matrix Analysis of Transferred Nuclear Overhauser Effects, Feng Ni, Journal of Magnetic Resonance 96, 651–656 (1992).

Theory of the Time Dependent Transferred Nuclear Overhauser Effect: Applications to Structural Analysis of Ligand–Protein Complexes in Solution, G. M. Clore et al., Journal of Magnetic Resonance 53, 423–442 (1983).

Influence of Conformational Exchange on the 2D NOESY Spectra of Biomolecules Existing in Multiple Conformations, Weontae Lee et al., Journal of Magnetic Resonance 98, 36–48 (1992).

Theory and Applications of the Transferred Nuclear Overhauser Effect to the Study of the Conformations of Small Ligans Bound to Proteins, G. M. Clore et al., Journal of Magnetic Resonance 48, 402–417 (1982).

Effect of Slow Conformational Exchange on 2D NOESY Spectra, Boyoung Choe et al., Journal of Magnetic Resonnance 94, 387–393 (1991).

Structural Comparison Suggests That Thermolysin and Related Neutral Proteases Undergo Hinge–Bending Motion during Catalysis, D. R. Holland et al., Biochemistry 1992, 31: 11310–11316.

Crystallographic Evidence of a Large Ligand–Induced Hinge–Twist Motion between the Two Domains of the Maltodextrin Binding Protein Involved in Active Transport and Chemotaxis, Andrew J. Sharff et al., Biochemistry 1992, 31, 10657–10663.

Structure of Influenza Virus Neuraminidase B/Lee/40 Complexed with Sialic Acid and a Dehydro Analog at 1.8–Å Resolution: Implications for the Catalytic Mechanism, Musiri N. Janakiraman et al., Biochemistry 1994, 33, 8172–8179.

Complete Relaxation and Conformational Exchange Matrix (CORCEMA) Analysis of NOESY Spectra: Applications to Transferred NOESY and Protein Folding Studies, Hunter N. B. Moseley et al., 35th Experimental NMR Conference, Abstract WP 115, Asilomar, California, 1994.

Two–Dimensional Nuclear Overhauser Effect: Complete Relaxation Matrix Analysis, Brandan A. Borgias et al., Methods in Enzymology, vol. 176, pp. 169–183 (1989).

On the Evaluation of Interproton Distances for Three–Dimensional Structure Determination by NMR Using a Relaxation Rate Matrix Analyis, Carol Beth Post et al., J. Am. Chem. Soc. 1990, 112, 6796–6803.

Structure Determination from NOESY Intensities Using a Metropolis Simulated–Annealing (MSA) Refinement of Dihedral Angles, Yuan Xu et al., Journal of Magnetic Resonance, Series B 108, 192–196 (1995).

A Global Optimization Method Based on Variable Target Functions for Fitting of the Experimental and Calculated NOESY Spectra, Yuan Xu et al., Journal of Magnetic Resonance; Series B 107, 201–209 (1995).

A variable target intensity–restrained global optimization (VARTIGO) procedure for determining three–dimensional structures of polypeptides from NOESY data: Application to gramicidin–S, Yuan Xu et al., Journal of Biomolecular NMR, 5 (1995) 37–48.

A Theoretical Study of Distance Determinations from NMR. Two–Dimensional Nuclear Overhauser Effect Spectra, Joe W. Keepers et al., Journal of Magnetic Resonance 57, 404–426 (1984).

COMATOSE, A Method for Constrained Refinement of Macromolecular Structure Based on Two–Dimensional Nuclear Overhauser Effect Spectra, Brandan A. Borgias et al., Journal of Magnetic Resonance 79, 493–512 (1988).

Determination of Biomolecular Structures from Proton–Proton NOE's Using a Relaxation Matrix Approach, R. Boelens et al., Journal of Molecular Structure, 173 (1988) 299–311.

Use of a Double–Half–Filter in Two–Dimensional $^1$H Nuclear Magnetic Resonance Studies on Receptor–Bound Cyclosporin, G. Wider et al., J. Am. Chem. Soc. 1990, 112, 9015–9016.

Deuteration in Protein Proton Magnetic Resonance, David M. LeMaster, Methods in Enzymology, vol. 177, pp. 23–43 (1989).

"Investigation of Rates and Mechanisms of Reactions," Claude F. Bernasconi (Ed.), Techniques of Chemistry Series, vol. VI, Part I, Chap. VI, Wiley–Interscience, New York, 1986.

Structures and Mechanism of Enzymes, William N. Lipscomb, Proc. Robert A. Welch Found. Conf. Chem. Res., pp. 131–182 (1971).

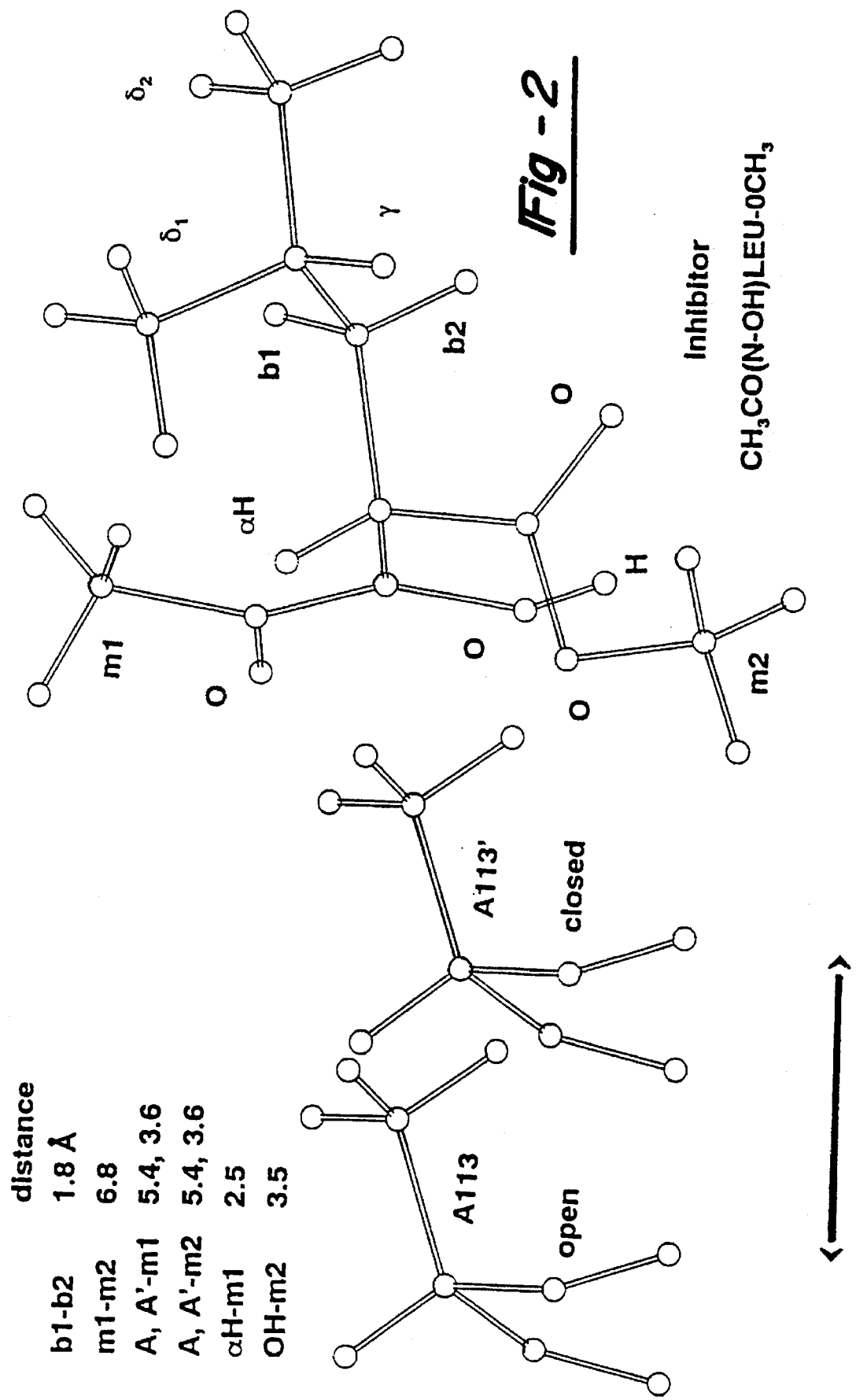

A' - X'

1 - 2

1 - 1

2 - 2

2 - 1

METHOD FOR ANALYZING 2D TRANSFERRED NOESY SPECTRA OF MOLECULES UNDERGOING MULTISTATE CONFORMATIONAL EXCHANGE

BACKGROUND OF THE INVENTION

1. Field of the Invention

The present invention relates to a method and apparatus for modeling molecules. In another aspect, the present invention relates to a method and apparatus for modeling molecules undergoing change between conformational states. In even another aspect, the present invention relates to a method and apparatus for modeling the 2D-NOESY spectra of interacting systems undergoing multistate conformational exchange.

2. Description of the Related Art

The analysis of nuclear Overhauser effects ("NOE") in multispin systems by the use of isolated spin pair approximation ("ISPA") is often inadequate since it neglects multispin effects, i.e., three spin effects for small molecules with short correlation times, and spin diffusion effects for large molecules with longer rotaional correlation times. See, Krishna et al., Biophys. J., 24:791 (1978). To get meaningful structural information on macromolecules, it is necessary to take these effects into account properly through a total relaxation matrix analysis of experimental NOE intensities. See, Krishna et al., supra.; Keeper et al., J. Magn. Reson.; 57:404 (1984), Borgias et al., J. Magn. Resort., 79:493 (1988); and see, Borgias et al., Methods in Enzymology, 176:169 (1989). In order to systematically account for these effects in the analysis of 2D-NOESY spectra, and to gain precise structural information of nucleic acids and proteins, algorithms based on complete relaxation matrix analyses ("CORMA") have been developed. In one such algorithm a total relaxation matrix methodology is utilized where experimental NOEs can be compared with those predicted for different models using NOE R-factors. See, Krishna et al., supra. Many other variations of complete relaxation matrix analyses of NOESY intensities have been proposed. See, Boelens et al., J. Mol. Struct., 173:299 (1988); Post et al., J. Amer. Chem. Soc., 112:6796 (1990); Mertz et al., J. Biomol. NMR, 1:257(1991); and Sugar et al., Prog. Biophys. Molec. Biol., 58:61 (1992). In all these treatments, there is usually the assumption of a single conformation for the macromolecule under consideration.

When the macromolecular system exhibits a conformational exchange as well, as in the case of a ligand exchanging between free and enzyme-bound forms, a protein interacting with DNA, or a protein existing in equilibrium between distinct conformations, it is necessary to incorporate properly such exchange effects in a complete relaxation matrix analysis. See, Choe et al., J. Magn. Reson. 94:387. A preliminary account of a formalism for complete relaxation and conformational exchange matrix ("CORCEMA") has been suggested. See, Lee et al., J. Magn. Reson. 98:36 (1992), and see, Krishna et al., Biophys. J. 61:A33 (1992). This work presented the general theory for a multispin system exchanging between two states, and illustrated its application with simulated examples of a DNA fragment exchanging between right and left handed forms, and a transferred NOESY analysis of a pair of ligand protons exchanging between free and enzyme-bound forms.

In literature so far, the primary focus of transferred NOESY analysis has been to deduce the conformation of a small ligand (e.g., an inhibitor) when it is bound to a much larger protein (such as an enzyme). Several examples along with the current status of this method have been reviewed recently. See, F. Ni, Prog. NMR Spectroscopy, 26:517 (1994). When the binding between the ligand and the protein is tight (with $K_d \sim 10^{-9}$ M), direct study of the ligand in its complexed form is utilized. However, when the binding constant is somewhat weaker, it is possible to deduce the bound conformation from a study of the free ligand resonances since the cross relaxation information in the bound state is transferred to the free state when the enzyme off-rates are comparable to or faster than the relaxation rates in the bound form. The theory for steady state 1D-transferred NOEs is known, see, Clore et al., J. Magn. Reson. 48:402(1982), and it has been extended to selective saturation-based time dependent transferred NOEs with an emphasis on an analysis of initial slopes, see, Clore et al., J. Magn. Reson. 53:423(1983). Under these conditions, useful structural information in the bound state is obtained if the conformational exchange is fast on the relaxation rate scale.

Four major factors that need to be considered in a relaxation matrix analysis of tr-NOESY are: (i) the possibility of extracting meaningful structural information from a time-course analysis (rather than depending only on initial slopes) of the NOESY spectra even when the off- and on-rates are not fast on the relaxation rate scale, thus significantly extending the range of utility of the tr-NOESY technique; (ii) the ability to quantitatively account for intermolecular ligand-protein cross relaxation in the bound state; (iii) the possibility that the large protein or enzyme may exhibit a binding mode different from the traditional rigid lock-and-key type of fit for the ligand; and (iv) multiple conformations of the bound ligand. Additional minor factors include multiple binding sites on the enzyme as well as nonspecific binding.

The issue in the first factor, analysis of tr-NOESY when the off-rates are comparable to relaxation rates, is recognized in the art, with general theoretical frame works disclosed. See, Lee et al., J. Magn. Reson. 98:36 (1992); Krishna et al., Biophys. J. 61:A33(1992); Ni, J. Magn. Reson. 96:651 (1992); London et al., J. Magn. Reson. 97:79(1992); and Lippens et al., J. Magn. Reson. 99:268(1992). The main advantage of these formulations is that the utility of the tr-NOESY technique is now extended to a much wider range of off- and on-rates, rather than restrictive regime of exchange rates faster than the relaxation rates. This is significant because large molecular weight enzyme complexes are characterized by larger cross-relaxation rates which may become comparable to enzyme off-rates. All these theoretical formulations have been cast for treating multispin systems.

Many traditional analyses of tr-NOE experiments have routinely neglected ligand-protein intermolecular cross relaxation, partly because: (a) there was no adequate theoretical frame work available to account for them, (b) it simplified the analyses considerably, and (c) in some instances the structure of the enzyme was presumably unknown and hence it was difficult to take this cross relaxation into account. In some cases, it may be possible to selectively saturate the protein resonances to minimize protein-mediated spin diffusion effects. See, Clore et al., J. Magn. Reson. 53:423(1983).

Of course, any serious effort on a structure-based design of a protein-binding ligand will substantially benefit from the ability to explicitly incorporate the intermolecular contacts with the protein, rather than suppressing them or ignoring them. This is because the conformation of the active site it self can change substantially depending upon the different chemical modifications on the ligand. Such a situation has been recently observed during the design of a series of purine nucleotide phosohorylase inhibitors. See, Ealick et al., Proc. Nat'l. Acad. Sci. USA, 88:11540(1991). In those instances where one is constrained to work with very dilute concentrations (i.e., undetectable) of an enzyme, a common situation in traditional tr-NOE applications, a good starting point for these kind of calculations is provided by the crystallographic data on some known homologus enzymes and enzyme-ligand complexes. Alternatively, if the enzyme is amenable to over expression and isotope labelling by recombinant methods, it may be desirable to work with lower ligand/enzyme ratios to be able to observe the ligand or enzyme resonances by isotope filtered/directed NMR methods. Neglect of ligand-protein interactions can lead to misleading conclusions about the bound conformation of the ligand.

An implicit assumption usually made is that the bound conformation deduced by the tr-NOESY technique corresponds directly to that of the ligand bound in the active site. Indeed, such an assumption is not unreasonable either (i) if the active site with and without the ligand remains essentially identical (e.g., neuraminidase, see Janakiraman et al)., Biochemistry, 33:8172(1994)) as in the rigid lock-and-key model, or (ii) when the process of ligand binding to and release from the active site (into the solvent) is instantaneous.

Complications do arise, however, when the ligand binding process does not follow the rigid lock-and-key model, and the active site on the enzyme exhibits distinct conformational movements following the initial binding of a ligand. These motions can be fast (motion of sidechains) or slow (domain motions). Indeed, enzymes such as thermolysin and related neutral proteases exhibit hinge-bending motion upon binding to inhibitor. See, Holland et al., Biochemistry 31:11310(1992). Similar hinge-bending motions were observed in a class of periplasmic proteins. See, Quiocho, Current Opinion in Structural Biology 1:922(1991). Other known examples are as follows. The maltodextrin binding protein (MBP), a "Venus flytrap" type of rigid-body hinge-bending motion of two globular domains through an angle of 35° has been described upon ligand binding. An examination of the crystal structure of yeast hexokinase-glucose complex shows clearly that the substrate in the active site is essentially shielded from the solvent. In order for it to be released, the cleft formed by the two domains of the enzyme need to open up first—a process that clearly takes finite time. Adenylate kinase provides a very dramatic example since the binding of AMP and ATP (at two separate sites) involves separate domain motions over 39° and 92°. The driving force for such conformational changes presumably is provided by the exclusion of water molecules from the active site by the bound ligand. A hinged "lid" formed by seven residues in triosephosphate isomerase (TIM) moves over 7 Å to close in the substrate in the active site. A somewhat smaller scale movement, the "swinging gate" motion, has been observed in the binding of inhibitors to the human purine-nucleoside phosphorylase. This gate is formed by a 20-residue segment in the enzyme which undergoes a short helical transformation on inhibitor binding. This type of binding belongs to the so called "induced fit" binding, where the active site exhibits considerable fluidity and undergoes conformational changes to accommodate different types of ligands. Another well known example involves carboxypeptidase A, a proteolytic enzyme that hydrolyzes the C-terminal peptide bond in polypeptides. The binding of glycyltyrosine to carboxypeptidase A is accompanied by a structural rearrangement of the enzyme consisting of a nearly 12 Å movement of the phenolic group of Y-248 and smaller movements of 2 Å by R-145 guanidinium and E-270 carboxylate groups. In the case of lysozyme (adsorbed on mica), atomic force microscopy measurements have detected conformational changes of the order of 5 Å lasting for ~50 ms in the presence of a substrate. All these motions involve a movement of protein domains or a short segment of residues or the sidechains of some residues, to facilitate the ligand in reaching its "final" active site. It is easily appreciated that motions of this type have the potential to modulate the intermolecular ligand-protein NOESY contacts, as well as the intramolecular contacts due to the accompanying conformational changes. Hence there is a clear need to develop a general theory of tr-NOESY that can incorporate such large or small scale protein motions.

Finally, the ligand it self may exhibit conformational transitions while bound to the protein. Hence any attempt to determine the so called bound conformation of a ligand must properly address this conformational malleability of the ligand as well.

The above techniques are not sufficient to model interacting macromolecular systems that are conformationally dynamic.

Additionally, the above techniques are also not sufficient to handle the general n-state conformational exchange case for interacting multispin systems such as a ligand and an enzyme.

Thus, there is a need in the art for improved modeling methods.

There is another need in the art for improved techniques for modeling interacting macromolecular systems that are conformationally dynamic.

There is even another need in the art for improved techniques for modeling the general n-state conformational exchange case for interacting multispin systems such as a ligand and an enzyme.

These and other needs in the art will become apparent to those of skill in the art upon review of this specification, including its claims and drawings.

SUMMARY OF THE INVENTION

According to one embodiment of the present invention there is provided a method of determining two-dimensional nuclear- or rotating frame-Overhauser effect spectroscopy intensities for a ligand-enzyme system having flexible active cites, wherein the ligand-enzyme system has at least 2 conformational states. The method includes inputting data into a modeling computer, wherein the data relates to coordinates for each molecule on the enzyme and ligand, kinetic data, correlation times, and concentrations of ligand and enzyme. Next, the method includes creating a K matrix file containing a kinetic matrix of the kinetic data, and creating a R matrix file containing an R matrix derived from the correlation times and the coordinates. Then, a dynamic matrix D is created as the sum of the K matrix and the R matrix. Next, the method includes modifying the D matrix file by symmetrizing the D matrix with a symmetrizing matrix $S_N$, followed by diagonalization, wherein $S_N$ is as follows:

$$S_N = \begin{matrix} [L_1]^{1/2} & & & & \\ & [E_1]^{1/2} & & & \\ & & [L_2]^{1/2} & & \\ & & & [E_2]^{1/2} & \\ & & & & \ddots \\ & & & & & [L_N]^{1/2} \end{matrix}$$

wherein N is the number of conformational states for the ligand and enzyme, with L and E representing ligand and enzyme states, repectively. Finally, the Overhauser effect spectroscopy intensities may be derived from this symmetrized and diagonalized D matrix.

According to another embodiment of the present invention there is provided an apparatus for determining two-dimensional nuclear- or rotating frame-Overhauser effect spectroscopy intensities for a ligand-enzyme system having flexible active cites, wherein the ligand-enzyme system has at least 2 conformational states. The apparatus generally includes an input mechanism for inputing data relating to coordinates for each molecule on the enzyme and ligand, kinetic data, correlation times, and concentrations of ligand and enzyme. Next, the apparatus includes routines for creating and storing a K matrix file containing a kinetic matrix of the kinetic data, and for creating and storing an R matrix file containing an R matrix derived from the correlation times and the coordinates. The apparatus further includes routines for creating a dynamic matrix D, which is the sum of the K matrix and the R matrix. Next, the apparatus includes routines for modifying the D matrix file by symmetrizing the D matrix with a symmetrizing matrix $S_N$, followed by diagonalization, wherein $S_N$ is as follows:

$$S_N = \begin{matrix} [L_1]^{1/2} & & & & \\ & [E_1]^{1/2} & & & \\ & & [L_2]^{1/2} & & \\ & & & [E_2]^{1/2} & \\ & & & & \ddots \\ & & & & & [L_N]^{1/2} \\ & & & & & & [E_N]^{1/2} \end{matrix}$$

wherein N is the number of conformational states for the ligand and enzyme, with L and E representing ligand and enzyme states, repectively. Finally, the apparatus includes routines for deriving the Overhauser effect spectroscopy intensities from this symmetrized and diagonalized D matrix.

BRIEF DESCRIPTION OF THE DRAWINGS

FIG. 2 is a hypothetical model of thermolysin-inhibitor complex showing the movement of Ala-113 on the enzyme due to hinge-bending motion, and is based on the published crystal structure of the enzyme with an irreversible inhibitor. The changes made in the leucine-inhibitor to adapt to the transferred NOESY calculations are described in the text. Only one residue, viz., Ala-113, in the active site of the enzyme is shown in the figure, even though a total of nine residues were included in the calculations. In the closed state of the complex, Ala-113 in the enzyme is located considerably closer to the inhibitor, than in the open state. Some of the effective distances are given in the figure.

DETAILED DESCRIPTION OF THE INVENTION

Multistate Model of Ligand-Enzyme Interactions:

The dynamic matrix D that governs the time evolution of the cross peak intensities in a 2D-NOESY experiment is given by $$D=R+K \quad [1]$$

where R is the relaxation rate matrix, and K is the kinetic matri. The kinetic matrix has elements given by $$K_{ii}=\Sigma' k_{ij}, \text{ and } K_{ij}=-k_{ji} \ (j \neq i) \quad [2]$$

where $k_{ij}$ is the rate for exchange from conformations i to j. If $P_k$ is the fractional population of molecules in conformation k, then the elements of the kinetic matrix further satisfy the following two relationships $$\sum_m K_{mk}=0 \quad [3]$$

$$\sum_m K_{km} P_m=0 \quad [4]$$

Eq.[3] represents the law of conservation, and simply states that the number of molecules leaving any conformational state "k" must be equal to the total number of molecules entering other conformational states from state "k". Eq.[4] represents the law of equilibrium, and states that the total number of molecules leaving state "k" must be equal to the total number of molecules entering state "k" from all the other states. From Eqs.[2] to [4] it follows that a row vector composed of 1's and a column vector composed of the fractional populations, constitute an eigen vector pair corresponding to the zero eigen value of the kinetic matrix K (34). Using this property, it is known that for noninteracting systems when the conformational exchange rates are much faster than the relaxation rates in all the conformations, the effective relaxation rate (or rate matrix for multispin systems) is simply a weighted average of relaxation rates (or rate matrices) in the N individual conformations:

$$<R>=\sum_k R_k P_k \quad [5]$$

where $<R>$ is the effective relaxation rate matrix, $R_k$ is the relaxation rate matrix for the $k^{th}$ conformation with a fractional population $P_k$.

In the method of the present invention, the R and K matrices are generalized relaxation and kinetic matrices, respectively, and are composed of submatrices to describe each molecular species in each state. As used herein in this specification, italicized matrices represent generalized rate matrices. The manner in which they are defined becomes obvious from the two-state and three-state examples given below.

The NOESY intensities $I_{ij}$ (τ) at a mixing time τ are calculated from the expression, $$I(\tau)=e^{-[R+K]\tau} I(0) \quad [6]$$

where I (τ) is a square matrix of intensities for all the molecules, and I(O) is a square matrix consisting of equilibrium concentration matrices in each of the states. If U is the transformation matrix that diagonalizes [R+K], $$U^{-1}[R+K]U=\Lambda \quad [7]$$

where Λ is a diagonal matri. Then Eq. [6] becomes, $$I(\tau)=U \ e^{-\Lambda\tau} U^{-1} \ I(O) \quad [8]$$

Figure 1:
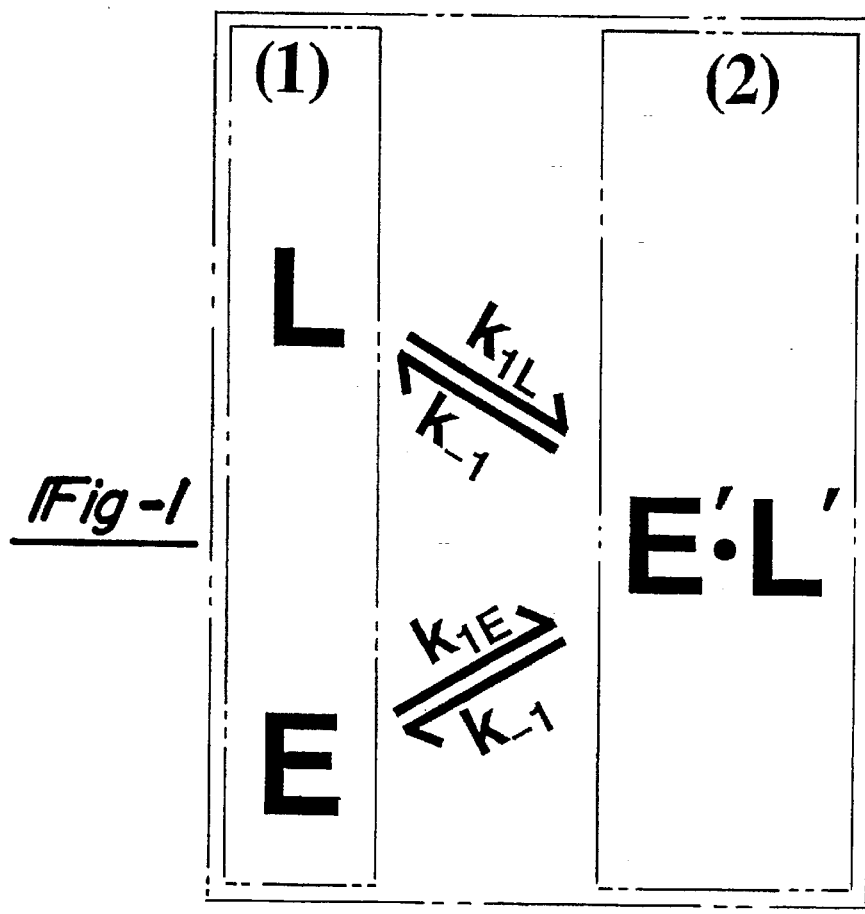
FIG. 1 is a schematic representation showing ligand-enzyme interaction as a two-state model, with State 1 characterized by free ligand and free enzyme, and State 2 characterized by a complex in which both the molecules could change on complexation.

Two-state Model of Ligand-Enzyme Interaction:

This model is characterized by the free-state consisting of the interacting species L and E in their uncomplexed form, and the bound state in which they form a complex L'.E' as shown in FIG. 1. The primes indicate that the conformations of the ligand and the enzyme in the bound state could be different from those in the free state. In this scheme, $k_{1L}$=$k_1$ [E] and $k_{1E}$=$k_1$ [L] are the on-rates for the ligand and enzyme respectively. $k_{-1}$ is the off-rate.

The generalized R matrix is composed of generalized submatrices $R_F$ and $R_B$, for the free and bound states, respectively. They are defined as follows:

$$R = \begin{matrix} R_F & 0 \\ 0 & R_B \end{matrix} = \begin{matrix} R_L & 0 & 0 & 0 \\ 0 & R_E & 0 & 0 \\ 0 & 0 & R_{L'} & R_C \\ 0 & 0 & R_C^T & R_{E'} \end{matrix} \quad [9]$$

The $R_L$ and $R_E$ are the relaxation rate matrices for the ligand and enzyme, respectively, in their uncomplexed state. The diagonal and off-diagonal terms of these matrices take into account the complete dipolar connectivities. In addition, any leakage terms (such as dipolar relaxation of amide protons with the $N^{14}$ nucleus, solvent exchange rates, and relaxation due to dissolved paramagnetic oxygen) can be added to the diagonal elements. The absence of a cross relaxation between the ligand and enzyme in their free states is denoted by the zero off-diagonal elements of the $R_F$ matri. In a similar fashion, $R_{L'}$ and $R_{E'}$ are the relaxation rate matrices for the complexed form of the ligand and the enzyme, respectively. The intermolecular dipolar cross relaxation in the complex is denoted by $R_c$. This matrix is in general rectangular because of the different number of protons in the ligand and the enzyme. It is composed of the familiar $\sigma_{ij}$ (i≠j) terms responsible for cross relaxation. $R_c^T$ is its transpose. The $R_{L'}$ and $R_{E'}$ matrices include the diagonal elements associated with the intermolecular dipolar cross relaxation between the ligand and the enzyme, as well as the complete relaxation matrix elements for the intramolecular relaxation within the bound forms of the ligand and the enzyme. In the practice of the present invention, it is preferred to enter all equivalent protons (e.g., methyl protons) explicitly, so that the R matrix is always symmetric.

The generalized kinetic matrix K is composed of generalized kinetic submatrices $K_1$ and $K_{-1}$ defined as follows:

$$K = \begin{matrix} K_1 & -K_{-1} \\ -K_1 & K_{-1} \end{matrix} = \begin{matrix} k_{1L} & 0 & -k_{-1L} & 0 \\ 0 & k_{1E} & 0 & -k_{-1E} \\ -k_{1L} & 0 & k_{-1L} & 0 \\ 0 & -k_{1E} & 0 & k_{-1E} \end{matrix} \quad [10]$$

with $k_{1L}=K_{1L}\,1_L$, $k_{1E}=K_{1D}\,1_E$, and $k_{-1L}=K_{-1}\,1_L$ and $K_{-1E}=k_{-1}\,1_E$, where $1_N$ is a unit matrix of dimension N. Note that the dimension of the unit matrices vary depending upon the species involved (denoted by the subscript).

Because of the conformational exchange matrix K, the D matrix is not generally symmetric. Even though algorithms exist that can diagonalize asymmetric matrices such as D, it is preferable to reduce this matrix to a symmetric form in order to utilize the known standard orthogonal transformation routines meant for symmetric matrices. The D matrix can be bought into a symmetric form using asymmetrization matrix S defined below:

$$S = \begin{matrix} [L]^{1/2} & 0 & 0 & 0 \\ 0 & [E]^{1/2} & 0 & 0 \\ 0 & 0 & [L']^{1/2} & 0 \\ 0 & 0 & 0 & [E']^{1/2} \end{matrix} \quad [11]$$

wherein $[L]=[L]\,1_L$, $[E]=[E]\,1_E$, $[L']=[L']\,1_L$ and $[E']=[E']\,1_E$ where $[L]$, $[E]$, $[L']$ and $[E']$ $(=[L'])$ are the concentrations of the free and bound forms of the ligand and enzyme. This form of the symmetrization matrix is related to but slightly different from prior art forms (i.e. Ni, Prog. NMR Spectroscopy 26:517(1994)) in terms of separate ratios of equilibrium concentrations for ligand and enzyme in their free and bound forms, and the number of equivalent spins for each resolved resonance. However, this matrix definition lends itself to an automatic extension to any arbitrary number of states.

Thus the symmetrized dynamic matrix, $D_s$, is given by $$D_S = S^{-1} DS = R_s + K_s \text{ where,}$$

$$R_s = \begin{matrix} R_L & 0 & 0 & 0 \\ 0 & R_E & 0 & 0 \\ 0 & 0 & R_{L'} & R_{C[L'E]^{1/2}} \\ 0 & 0 & R^T_{C[E/L']^{1/2}} & R_E \end{matrix} \quad [12]$$

Thus, the relaxation matrix remains symmetric (since $[L']=[E']$). Similarly $K_s$ is given by $$K_s = \begin{matrix} k_{1L} & 0 & -k_{-1}[L'/L]^{1/2} & 0 \\ 0 & k_{1E} & 0 & -k_{-1}[E/E]^{1/2} \\ -k_{1L}[L/L']^{1/2} & 0 & -k_{-1} & 0 \\ 0 & -k_{1E}[E/E']^{1/2} & 0 & -k_{-1} \end{matrix} \quad [13]$$

From the relationships $k_{1L}\,[L]=k_{-1}\,[L']$ and $k_{1E}\,[E]=k_{-1}\,[E']$, it is easily shown that the exchange matrix $K_s$ is also symmetric. The symmetrized form of the dynamics matrix, $D_s$, can be put in a diagonal form, $\Lambda$, by a transformation T as, $$\Lambda = T^{-1} D_s T = T^{-1} S^{-1} \{R+K\} ST$$

The expression for NOESY intensities, Eqs.[6,8], now becomes $$I(\tau) = S T e^{-\Lambda \tau} T^{-1} S^{-1} I(O) \quad [14]$$

Fast Conformational Exchange

When the conformational exchange rates are much faster than the relaxation rates in the free and bound states of the ligand and the enzyme, a simplyfying result is obtained since in this case the relaxation matrix R can be treated as a minor perturbation on the kinetic matrix K, and a known perturbation theory treatment can be applied. The K matrix can be converted into a diagonal form by the transformation, $$\begin{matrix} 1 & 1 \\ -P_B & P_F \end{matrix} \begin{matrix} K_1 & -K_{-1} \\ -K_1 & K_{-1} \end{matrix} \begin{matrix} P_F & -1 \\ P_B & 1 \end{matrix} = \begin{matrix} 0 & 0 \\ 0 & (K_1+K_{-1}) \end{matrix} \quad \text{Eq.}[15]$$

In the above equation, $$P_F = \begin{matrix} P_L & 0 \\ 0 & P_E \end{matrix} \text{ and } P_B = \begin{matrix} P_{L'} & 0 \\ 0 & P_{E'} \end{matrix} \quad [16]$$

where, $P_L=P_L 1_L$ and $P_E=P_E 1_E$ etc. $P_L$ $(=1-P_{L'})$ and $P_E(=1-P_{E'})$ are the fractional populations for the free forms of the ligand and enzyme, respectively. Since the R matrix is now a minor perturbation, its contribution in first order to the dynamic matrix will be significant only to the "zero" diagonal element of the diagonalized form of K matrix in Eq.[15]. This contribution is given by the following Eq.[17]

$$\lambda_1 = \begin{matrix} 1 & 1 \end{matrix} \begin{matrix} R_F & 0 \\ 0 & R_B \end{matrix} \begin{matrix} P_F \\ P_B \end{matrix} = R_F P_F + R_B P_B = <R>$$

The important result here is that the pertinent generalized relaxation rate matrix that governs the intensities in the NOESY spectrum is simply a weighted average of the generalized relaxation rate matrices for the free and the bound states.

Note that because of $R_E P_E$, the $\lambda_1$ matrix is asymmetric, but can be readily put in a symmetric form using a similarity transformation with a diagonal symmetrization matrix (and its inverse) that has $P^{1/2}_{L'}$ and $P^{1/2}_{E'}$ as its diagonal elements, where, $P_{L'}$ and $P_{E'}$ are the fractional populations for the ligand and the enzyme in their bound forms.

Thus, now one obtains, the diagonalized form of the dynamic matrix as $$\Lambda = \begin{matrix} <R> & 0 \\ 0 & (K_1+K_{-1}) \end{matrix} \quad [18]$$

Equation [8] now becomes, $$I(\tau) = \begin{matrix} P_F & -1 \\ P_B & 1 \end{matrix} \begin{matrix} e^{-<R>\tau} & 0 \\ 0 & 0 \end{matrix} \begin{matrix} 1 & 1 \\ -P_B & P_F \end{matrix} I(0) \quad [19]$$

taking advantage of the fact that $\exp\{-(K_1+K_{-1})\}\tau \approx 0$ for normal mixing times employed in NOESY experiments, because of fast conformational exchange. Substituting for I(O) in terms of concentrations, yields $$I(0) = \begin{pmatrix} C_F & 0 \\ 0 & C_B \end{pmatrix} = \begin{pmatrix} [L] & 0 & 0 & 0 \\ 0 & [E] & 0 & 0 \\ 0 & 0 & [L'] & 0 \\ 0 & 0 & 0 & [E'] \end{pmatrix} \quad [20]$$

$C_F$ and $C_B$ are concentration matrices for the free and bound states. Thus, $I(\tau)$ is given by, $$I(\tau) = \begin{pmatrix} P_F e^{-\langle R \rangle \tau} C_F & P_F e^{-\langle R \rangle \tau} C_B \\ P_B e^{-\langle R \rangle \tau} C_F & P_B e^{-\langle R \rangle \tau} C_B \end{pmatrix} \quad [21A]$$

Under experimental conditions where the conformational exchange is fast on the chemical shift scale, only one set of resonances is observed for the ligand and one set for the enzyme protons, yielding the following Eq.[21B]

$$I(\tau) = P_F e^{-\langle R \rangle \tau} C_F + P_F e^{-\langle R \rangle \tau} C_B + P_B e^{-\langle R \rangle \tau} C_F + O_B E^{-\langle R \rangle \tau} C_E$$

From the above equation, it is clear that the NOESY spectrum is determined by a generalized relaxation rate matrix which is a weighted average of the rate matrices for the free and bound states (i.e., including the protons on the ligand and the enzyme, and the intermolecular cross relaxation in the bound form).

Absence of Ligand-Enzyme cross relaxation:

In the absence of intermolecular cross relaxation, Eq.[17] yields the much simpler result for the effective relaxation rate matrix of the ligand, $$\langle R_L \rangle = P_L R_L + P_{L'} R_{L'} \quad [22]$$

A similar result is obtained for the enzyme.

Figure 3:
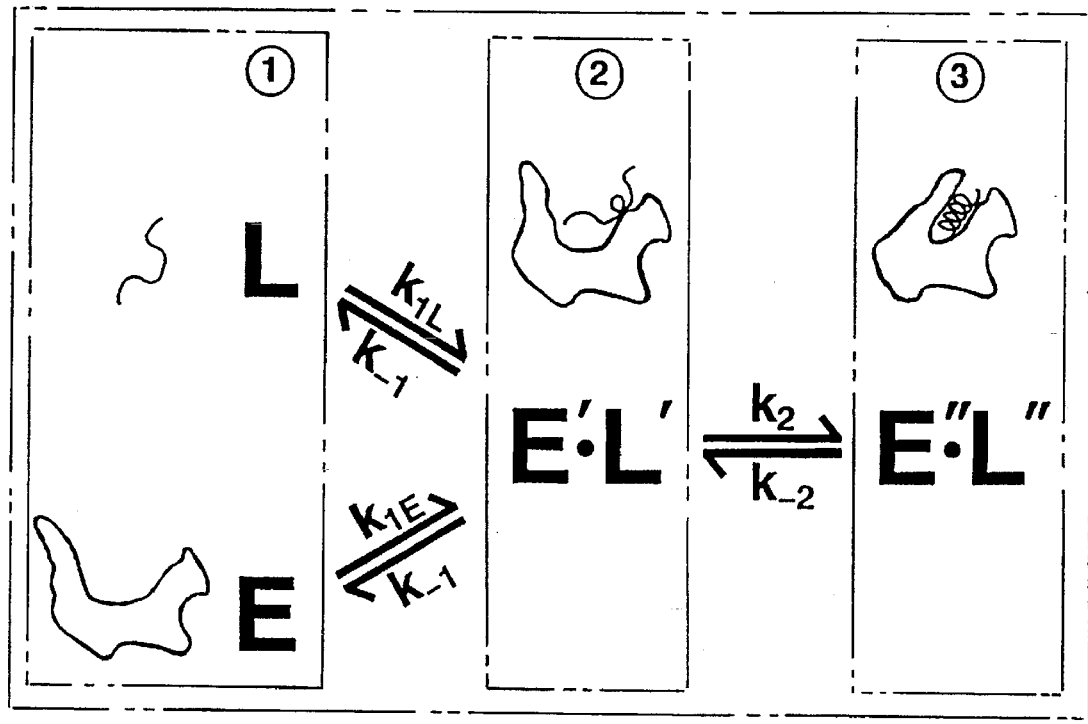
FIG. 3 is a schematic showing the 3-state model of ligand-enzyme interaction, in which State 1 corresponds to free ligand and free enzyme, State 2 corresponds to the ligand binding to the enzyme (at a nonspecific or weak binding site) where the protein domains are in an "open state", and in which State 3, shows the "closed state", with both domains coming closer together due to hinge-bending motion. The ligand occupies the "active site" between the domains only in the closed state, in this model.

Treatment for more than two states:

Illustrating such a multistate system is a ligand binding to an enzyme in its "open" state, followed by a hinge-bending motion on the enzyme that "closes in" the ligand in the active site. The ligand could bind to the open state of the enzyme at a nonspecific or a weak binding site. A specific example, see, FIG. 2, the hypothetical binding of Leu-inhibotor (CH$_3$CO(N—OH)Leu—O—CH$_3$) to thermolysin. Several other proteins showing this behaviour have been mentioned earlier. In general, all examples where binding in the active site is facilitated by induced fit or hinge-bending, fall into this category, and may involve more than three states. For the simplest of these, the following 3-state scheme shown in FIG. 3 is adopted. In this case, the R matrix is given by $$R = \begin{pmatrix} R_L & 0 \\ 0 & R_E \\ & & R_{L'} & R_C \\ & & R_C^T & R_E \\ & & & & R_{L''} & R_{C''} \\ & & & & R_{C''}^T & R_{E''} \end{pmatrix} \quad [23]$$

$$= \begin{pmatrix} R_1 & 0 & 0 \\ 0 & R_2 & 0 \\ 0 & 0 & R_3 \end{pmatrix} \quad [24]$$

Where, $R_{L''}$, $R_{E''}$ and $R_{C''}$ respectively refer to relaxation rate matrices for the ligand, the enzyme and ligand-enzyme cross-relaxation in the closed state (state 3 in FIG. 3). The identification of submatrices $R_1$, $R_2$ and $R_3$ on the right side in the two equations of the R matrix is obvious.

The kinetic matrix is shown as the following Eq.[25]

$$K = \begin{pmatrix} k_{1L} & 0 & -k_{-1L} & 0 & 0 & 0 \\ 0 & k_{1E} & 0 & -k_{-1E} & 0 & 0 \\ -k_{1L} & 0 & (k_{-1L}+k_{2L}) & 0 & -k_{-2L} & 0 \\ 0 & -k_{1E} & 0 & (k_{-1E}+k_{2E}) & 0 & -k_{-2E} \\ 0 & 0 & -k_{2L} & 0 & k_{-2L} & 0 \\ 0 & 0 & 0 & -k_{2E} & 0 & k_{-2E} \end{pmatrix} \quad [26]$$

$$= \begin{pmatrix} K_{12} & -K_{21} & 0 \\ -K_{12} & (K_{21}+K_{23}) & -K_{32} \\ 0 & -K_{23} & K_{32} \end{pmatrix}$$

where, $$K_{12} = \begin{pmatrix} k_{1L} & 0 \\ 0 & k_{1E} \end{pmatrix}; K_{21} = \begin{pmatrix} k_{-1L} & 0 \\ 0 & k_{-1E} \end{pmatrix}; \quad \text{Eq.[27]}$$

$$K_{23} = \begin{pmatrix} k_{2L} & 0 \\ 0 & k_{2E} \end{pmatrix}; K_{32} = \begin{pmatrix} k_{-2L} & 0 \\ 0 & k_{-2E} \end{pmatrix}$$

Here, for the general case where the ligand and the enzyme can undergo independent conformational changes, $k_{2L}=k_{2L}1_L$, $k_{2E}=k_{2E}1_E$, $k_{-2L}=k_{-2L}1_L$, and $k_{-2E}=k_{-2}1_E$. In the practice of the present invention it is preferred to utilize the special case where $k_{2L}=k_{2E}=k_2$ and $k_{-2L}=k_{-2E}=k_{-2}$, to describe hinge-bending motions. The dynamic matrix in this case can be bought into a symmetric form by the symmetrization matrix S, $$S = \begin{pmatrix} [L]^{1/2} & & & & & \\ & [E]^{1/2} & & & & \\ & & [L']^{1/2} & & & \\ & & & [E']^{1/2} & & \\ & & & & [L'']^{1/2} & \\ & & & & & [E'']^{1/2} \end{pmatrix} \quad [28]$$

This is a simple extension of the symmetrization matrix for the two-state case to the three-state case; extension to n-states is now readily obtainable. In a manner exactly analogous to the two-state model, it is easily verified that the S matrix is able to reduce the R and K matrices into a symmetric form for the three-state case.

Subcase I: Conformational Exchange Fast on the Relaxation Scale for All Three States:

Under this limit, the R matrix can be treated as a minor perturbation on K, which can be diagonalized using the transformation, $$\begin{pmatrix} 1 & 1 & 1 \\ x & x & x \\ x & x & x \end{pmatrix} \begin{pmatrix} K_{12} & -K_{21} & 0 \\ -K_{12} & (K_{21}+K_{23}) & -K_{32} \\ 0 & -K_{23} & K_{32} \end{pmatrix} \begin{pmatrix} P_1 & x & x \\ P_2 & x & x \\ P_3 & x & x \end{pmatrix} = \begin{pmatrix} 0 & 0 & 0 \\ 0 & \lambda_2 & 0 \\ 0 & 0 & \lambda_3 \end{pmatrix} \quad [29]$$

In the transformation matrices, only elements (P$_1$P$_2$P$_3$ vector on the right side, and 1 1 1 vector on the leftside) corresponding to $\lambda_1(=0)$ eigenvalue matrix are shown. P$_1$, P$_2$, and P$_3$ for the 3-state case have definitions similar to P$_F$ and P$_E$ in Eq. [16] for the two-state case (with $P_L+P_{L'}+P_{L''}=1$, and $P_E+P_{E'}+P_{E''}=1$). x refer to elements in the transformation matrix that are not pertinent for the present calculation. $\lambda_2$ and $\lambda_3$ are composed of submatrices of eigen values that involve the conformational exchange rates, while the $\lambda_1$ eigenvalue is zero. The perturbation correction to this eigenvalue is now, $$\lambda_1 = \begin{matrix} 1 & 1 & 1 \\ 0 & 0 & 0 \\ 0 & 0 & 0 \end{matrix} \begin{matrix} R_1 & 0 & 0 \\ 0 & R_2 & 0 \\ 0 & 0 & R_3 \end{matrix} \begin{matrix} P_1 \\ P_2 \\ P_3 \end{matrix} = R_1P_1 + R_2P_2 + R_3P_3 \quad [30]$$

Using the transformation matrices U and $U^{-1}$ from Eq.[29] and the diagonal matrix $\Lambda$ with $\lambda_1$ (Eq.[30]), $\lambda_2$, and $\lambda_3$ elements (and setting $e^{-\lambda\tau}$, $e^{-\lambda\tau}=0$) it is easily shown from Eq.[8] that the intensity matrix $I(\tau)$ now consists of nine terms, in a manner analogous to Eq.[21B] for exchange fast on the chemical shift scale, but that the effective generalized relaxation rate matrix is simply given by Eq.[30].

The generalization of the above result for n-states is straightforward. For multistate conformational exchange situation where the conformational interconversion rates are much faster than the relaxation rates in each of the individual conformations (i.e., including the different bound forms of the ligand-enzyme complex), it follows that the pertinent generalized relaxation rate matrix is simply a weighted average of the generalized relaxation rate matrices in each of the individual states as given by $$<R> = \Sigma_k R_k P_k \quad [31]$$

where the summation includes not only the free state, but the many different bound states. This is a generalization, for interacting systems, of the result in Eq. [5].

Subcase II: Enzyme off- and on-rates much faster than the hinge-bending rates

For this subcase, it is assumed that $k_{23}$, $k_{32} \ll k_{21}$, $k_{1E}$ and $k_{1L}$, and assumed that the enzyme off- and on-rates are much faster than the relaxation rates in all three states. Under these conditions, the dynamic matrix D can be reexpressed as $$D = D_1 + D_2 \text{ where,} \quad [32]$$

$$D_1 = \begin{matrix} K_{12} & -K_{21} & 0 \\ -K_{12} & K_{21} & 0 \\ 0 & 0 & R_3 + K_{32} \end{matrix} ;$$

$$D_2 = \begin{matrix} R_1 & 0 & 0 \\ 0 & R_2 + K_{23} & -K_{32} \\ 0 & -K_{23} & 0 \end{matrix}$$

The $D_2$ matrix can be treated as a minor perturbation on the $D_1$ matrix which can be diagonalized using the transformation $Q^{-1}D_1Q=D_{diag}$ becoming Eq.[33] shown below:

$$\begin{matrix} 1 & 1 & 0 \\ -P'_2 & P'_1 & 0 \\ 0 & 0 & 1 \end{matrix} \begin{matrix} K_{12} & -K_{21} & 0 \\ -K_{12} & K_{21} & 0 \\ 0 & 0 & R_3+K_{32} \end{matrix} \begin{matrix} P'_1 & -1 & 0 \\ P'_2 & 1 & 0 \\ 0 & 0 & 1 \end{matrix} = \begin{matrix} 0 & 0 & 0 \\ 0 & K_{12}+K_{21} & 0 \\ 0 & 0 & R_3+K_{32} \end{matrix}$$

In the above equation, $P'_1$ and $P'_2$ have definitions analogous to those in Eq. (16), but with fractional populations normalized to free and open states only (i.e., $P_L+P_L=1$, and $P_E+P_E=1$). This results in $P'_1+P'_2=1$. Using the transformation matrices $Q^{-1}$ and Q given in Eq.[33] that diagonalize $D_1$, it is easily shown that the relevant matrix $\Lambda'$ that describes the time evolution is obtained from $D_1+D_2$ as (after neglecting off-diagonal terms that are negligible compared to the diagonal term $K_{12}+K_{21}$), $$\Lambda' = \begin{matrix} \{R_1P'_1 + (R_2+K_{23})P'_2\} & 0 & -K_{32} \\ 0 & K_{12}+K_{21} & 0 \\ -K_{23}P'_2 & 0 & R_3+K_{32} \end{matrix} \quad [34]$$

If Eq. [34] is further diagonalized using the transformation matrix P, we obtain $P^{-1}\Lambda'P=\Lambda$, where $$\Lambda = \begin{matrix} \lambda_1 & 0 & 0 \\ 0 & \lambda_2 & 0 \\ 0 & 0 & \lambda_3 \end{matrix} \quad [35]$$

where, $\lambda_2=(K_{12}+K_{21})$, and $\lambda_1$ and $\lambda_3$ represent the eigen value matrices corresponding to the diagonalization of the reduced matrix in Eq.[37] consisting of elements (1,1), (1,3), (3,1) and (3,3). If the contribution of the two off-diagonal elements is negligible (i.e., hinge-bending rate much slower than the relaxation rates) the following Eq.[36] is obtained which is the first-order approximation to the diagonal element $\lambda_1$, $$\lambda_1 = R_1P'_1 + (R_2+K_{23})P'_2 \quad [36]$$

The contribution of the exchange term can be safely neglected in Eq.[39B] for this subcase. The other two diagonal elements of the matrix $\Lambda$ are $\lambda_2=(K_{12}+K_{21})$ and $\lambda_3=R_3+K_{32}$. Note that $\lambda_1$ and $\lambda_3$ eigen value matrices still have off-diagonal elements because of cross-relaxation elements, and need further diagonalization to get individual eigen values. The $K_{23}P'_2$ matrix, however, is diagonal and hence adds terms to the diagonal elements of the relaxation rate matrix. Notice that, for the ligand fractional populations, $P'_L(=[L']/\{[L]+[L']\})$, and hence the product $k_{23}P'_L$ can be relatively small when the ligand is in excess of the enzyme. For example, if the ligand populations in the open and closed states are each 0.025, and in the free state 0.95, then $P'_L=0.026$. Thus, some of the real experimental situations might indeed pertain to the first-order situation. Eq.[36] predicts that under first order conditions and with large $P_L$, values, the ligand NOESY intensity decreases first as $K_{23}$ increases (since $K_{23}P'_2$ acts as a leakage factor). This is followed by an increase of the NOESY intensity as higher-order terms become important for larger $K_{23}$ in Eq.[34]. Thus, when the hinge-bending motion is much slower than the relaxation rates as well, the pertinent relaxation rate matrix for the ligand in fast exchange is essentially given by Eq.[36], and is independent of the active site conformation in the closed state. Under these conditions, the bound conformation of the ligand determined by tr-NOESY to the open state of the enzyme, and may reflect a nonspecific or a weak binding site. To deduce the active site conformation of the bound ligand, it is generally necessary to make direct observation of the closed state of the enzyme (which is likely to be in slow exchange on the chemical shift scale under these conditions)—a forbidding task when the enzyme is present in submillimolar concentration and the ligand is in excess.

Second, and higher order corrections due to conformational exchange between states 2 and 3 (i.e., due to the off-diagonal elements $K_{32}$ and $K_{23}P'_2$) are easily obtained from a diagonalization of the reduced matrix in Eq (34).

It is legitimate to ask what would happen if the hinge-bending rates ($K_{23}$ and $K_{32}$) are faster than the relaxation rates (but much slower than the enzyme off- and on-rates). In this case, $\Lambda'$ in Eq.[34] could be partitioned again into matrices containing exchange terms and relaxation terms. The exchange matrix can be put in a diagonal form using the transformation matrix P and its inverse:

$$\begin{bmatrix} 1 & 0 & 1 & K_{23}P'_2 & 0 & -K_{32} & (P_1+P_2) & 0 & -1 & 0 \\ 0 & 1 & 0 & 0 & (K_{12}+K_{21}) & 0 & 0 & 1 & 0 \\ -P_3 & 0 & (P_1+P_2) & -K_{23}P'_2 & 0 & K_{32} & P_3 & 0 & 1 & 0 \end{bmatrix} = \begin{bmatrix} 0 \\ (K_{12}+K_{21}) \\ (K_{23}P'_2+K_{32}) \end{bmatrix} \quad [37]$$

The first order correction due to the relaxation rate matrix will be significant only to the zero-th eigen value matrix in the above matrix, and is given by $$\lambda_2 = \begin{bmatrix} 1 & 0 & 1 & (R_1P'_1+R_2P'_2) & 0 & 0 & (P_1+P_2) \\ & & & 0 & 0 & 0 & 0 \\ & & & 0 & 0 & R_3 & P_3 \end{bmatrix} \quad [38]$$

$$= R_1P_1 + R_2P_2 + R_3P_3$$

Thus, the relevant generalized relaxation rate matrix is a weighted average of the rate matrices for the three different states, a result consistent with that in Eq.[30]. In this subcase, $\Lambda_3 = K_{23}P'_2 + K_{32}$ (and $\lambda_2 = K_{12} + K_{21}$ as in Eq.[35]). Thus, it is permissible to set $e^{-\lambda_3\tau} \approx 0$ and $e^{-\lambda_2\tau} \approx 0$ in Eq.[8]. Only $e^{-\lambda\tau}$ makes a contribution to the time evolution of the NOESY spectrum. For this special case, the transformation matrices U and $U^{-1}$ are given by $$U = QP = \begin{bmatrix} P_1 & -1 & -P'_1 \\ P_2 & 1 & -P'_2 \\ P_3 & 0 & 1 \end{bmatrix} ;$$

$$U^{-1} = P^{-1}Q^{-1} = \begin{bmatrix} 1 & 1 & 1 \\ -P'_2 & P'_1 & 0 \\ -P_3 & -P_3 & (P_1+P_2) \end{bmatrix} \quad \text{Eq.[39]}$$

Thus, information about the bound ligand conformation in the closed state is accessible through the transferred NOESY technique even when the hinge-bending rate is considerably slower than the enzyme off- and on-rates, provided it is much faster than (Eq.[38]) or somewhat comparable (Eq. [34]) to the the cross relaxation rates. If it is much slower than the cross relaxation rates, as mentioned before, direct observations on the closed state are necessary.

Subcase III: Protein motion much faster than the enzyme off- and on-rates.

In this subcase, proceeding in a manner analogous to Subcase II, provides the $\Lambda'$ matrix as $$\Lambda' = \begin{bmatrix} R_1+K_{12} & -K_{21}P'_2 & 0 \\ -K_{12} & (R_2+K_{21})P'_2+R_3P'_3 & 0 \\ 0 & 0 & K_{23}+K_{32} \end{bmatrix} \quad [40]$$

Notice that $P'_2+P'_3=1$ for this subcase. It is necessary to diagonalize the reduced rate matrix described by the elements (1,1), (1,2), (2,1) and (2,2) in the above equation to describe the time evolution of the ligand in the free state. If the off-rates are small, the bound state is effectively governed by a weighted average rate matrix given by $$\lambda_2 = (R_2+K_{21})P'_2+R_3P'_3. \quad [41]$$

Finally, it is obvious that any attempt to use a 2-state model to analyze transferred NOESY data on an enzyme-ligand complex exhibiting motional dynamics such as hinge-bending, will result in a virtual conformation which may not be meaningful. The 3-state models described here provide a better framework in which to analyze such data.

It is now straightforward to set up the generalized rate matrices and apply the method of the present invention to analyze the tr-NOESY spectrum of a more complex system (e.g., adenylate kinase) where an enzyme (E) interacts with two ligands (S1,S2) in a four-state equilibrium as follows:
(1) S1+E+S2⇌(2) S1·E+S2⇌(3) S1·E·S2⇌(4) S1+E·S2⇌
(1) S1+E+S2.

Neglect of intermolecular cross relaxation may have serious consequences on the correctness of the bound ligand conformation. This in turn may limit efforts at structure-based design of protein-binding ligands. Ideally, the experimentalist would have a knowledge (and the pdb files) of the three-dimensional structure of the enzyme under investigation. If this is not available, it may be possible to use published crystal and/or NMR structures of related proteins and molecular replacement methods to generate working models for the active site of the enzyme. Using NOESY back calculation and iterative refinement methods, it may be possible to deduce the final structures for the bound ligand and for the active site. It is relatively straightforward to check for the presence of significant ligand-protein cross relaxation. The most obvious approach would be to compare transferred NOESY data obtained with protonated and completely deuterated enzymes. Alternatively, the proton resonance envelope from the enzyme could be selectively saturated at a point or multiple points, hoping that this saturation would also spread to residues in the active site through efficient spin diffusion. As discussed earlier, this procedure may have some limitations if the life time of the bound ligand is comparable to cross relaxation times or if the active site is highly flexible. It may also be feasible to design specific pulse sequences to attenuate protein-mediated pathways.

The method of the present invention for treating more than two states, permits the examination of a variety of situations where the protein can experience motions upon ligand binding. Some of these motions can be fast (e.g., sidechain motions) or slow or comparable to relaxation rates (e.g., hinge-bending motions of protein domains). Based on the simulations performed here, when the hinge-bending motions are slower than the cross relaxation rates, the tr-NOESY intensities reflect primarily the environment in the "open state" of the enzyme. These open states may stand for non-specific or weak binding sites on the enzyme. Under these conditions, the utility of the tr-NOESY experiment as a method to study bound conformation in the "active site" may be severely compromised. Published tr-NOESY studies have detected nonspecific binding on enzymes in the presence of excess ligand.

If the protein motions are comparable to or faster than the protein cross- relaxation rates, however, one can access information about the bound state as well provided that at least a 3-state model is used, and proper account is taken of the relative populations of the open and closed states and of ligand-protein cross relaxation in both the open and closed states. A 2-state analysis of this situation will lead to a "virtual" conformation for the bound ligand, and may not be meaningful.

The present invention is aimed at predicting NOESY spectra for different dynamical models. These NOESY spectra may be compared with experimental NOESY spectra. Using a global analysis, the model that best fits the experimental data could be identified using NOE R-factors. If the models differ in the number of degrees of freedom (e.g., 2-state vs 3-state) Hamilton's statistical hypothesis testing criteria could be used to evaluate the significance of better fits with increasing number of variables. Such an approach is desirable to avoid overinterpretation of NOESY data using more complex models.

The present invention permits calculation of intermolecular ligand-enzyme NOESY contacts under a variety of dynamical conditions including protein motions. It is worthwhile to experimentally measure and exploit such contacts in structure-based drug design efforts. The intermolecular contacts can be identified using isotope edited/filtered methods. Such methods have been routinely used in studying complexes with tight binding. Even though traditional tr-NOE experiments tended to employ high ligand/enzyme ratios (in part because of scarcity of purified enzymes), there is some merit in working with lower ligand/enzyme ratios, especially if the protein can be overexpressed. The spin diffusion and line broadening problems associated with large enzymes can be alleviated somewhat with random fractional or selective deuteration/protonation. The crystal structures of a number of dynamical enzymes exhibiting distinct hinge-bending motions are already available. If the conformation(s) of an enzyme is unknown, some progress can be made by a combination of molecular replacement methods and known structures (NMR or x-ray) of homologous proteins as a start. The dynamics of the enzyme may be first probed using experimental tools such as atomic force microscopy, fluorescence resonance energy transfer, saturation transfer EPR, time resolved infrared spectroscopy, and luminescent lanthanide probes. In the practice of the present invention, it is desirable to get independent estimates of as many parameters (e.g., hinge-bending rates) as possible, so that one can confine optimization over a narrow range centered around these parameters. In the case of non-specific binding in an open state, a reasonable approximation for a starting conformation of the bound ligand is that it is similar to that of the free solution state, but with longer rotational correlation time. It may also be possible to manipulate the hinge-bending rates by protein engineering to bring them into a desirable range for tr-NOESY studies of ligands in the active site.

Even though the present invention has been described with respect to ligand-enzyme interactions, the present invention has applicability in the analysis of NOESY spectra of interacting species such as drug-DNA, protein-protein, protein-DNA and protein-carbohydrate systems under a variety of binding conditions. Additionally, though the present invention has been described with respect to NOESY spectra, it also has applicability to ROESY or rotating frame Overhauser effects spectroscopy.

EXAMPLES

A simulation program utilizing the above mathematics was developed to to compute NOESY spectra for different proposed models of a dynamical system, so that they can be compared directly with experimental NOESY spectra, and the quality of agreement can be calculated for different models. The program utilizes an R-factor based global comparison of experimental NOE intensities with those calculated using a total relaxation matrix calculation. No attempt is made to optimize iteratively the conformations of the ligand and the enzyme in the assumed dynamical model, or the magnitudes of the off-, on- and hinge-bending rates.

Figure 4:
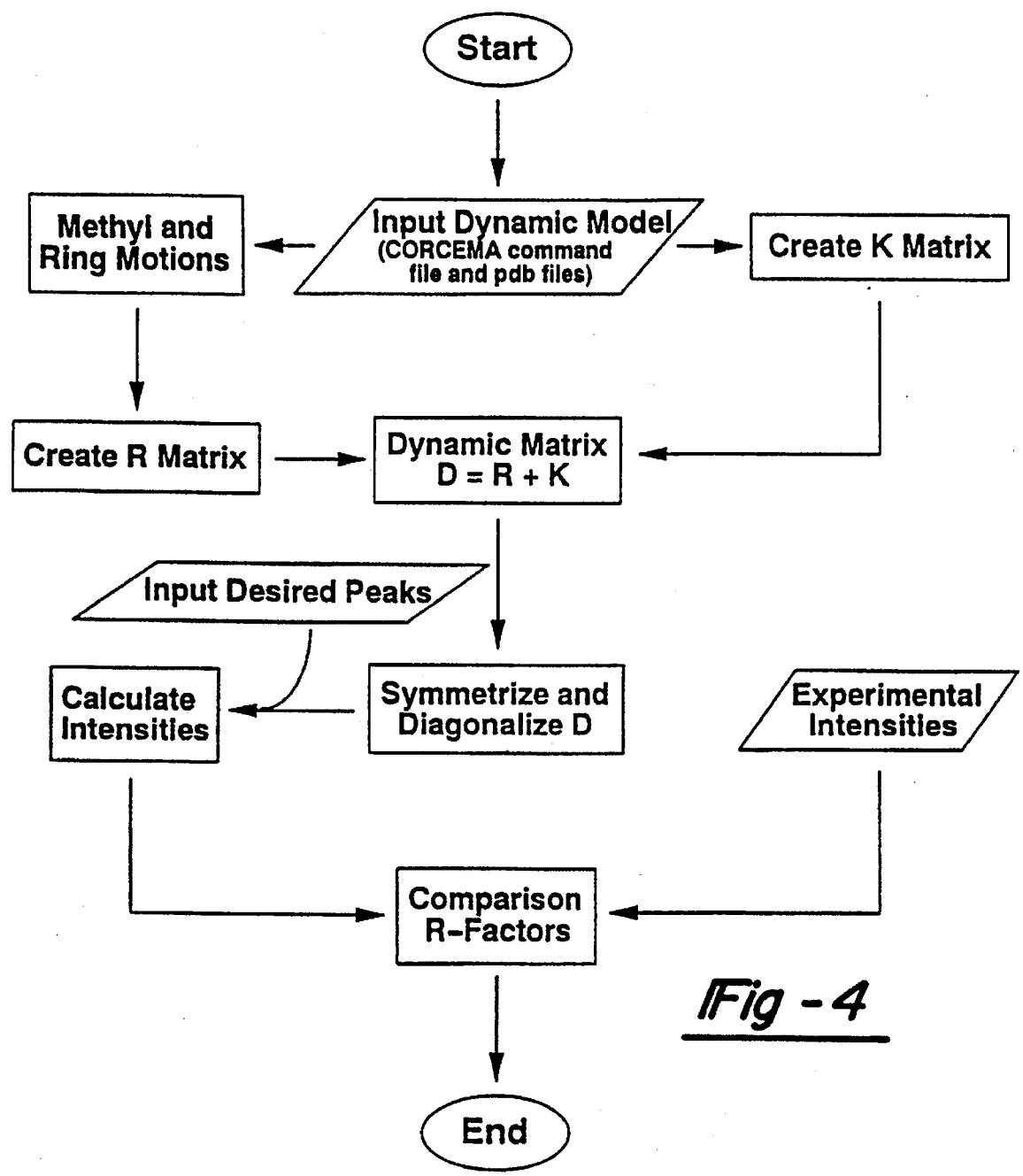
FIG. 4 is a flowchart of the program utilized in the Examples.

The flow chart for the program is shown in FIG. 4. It can handle N-state conformational exchanges. The entire program was written in C, and has a modular architecture so that it can be modified easily. The program is compiled on a Silicon Graphics workstation with UNIX operating system. No machine-specific calls are made in the program, so that it will be compatible with other computers and operating systems.

The required input files are the number of states involved in the equilibrium (e.g., 3 states for the hinge-bending motion example), the coordinates (in pdb format) of the various molecular species in their free and bound forms, overall rotational correlation times, and magntidues of the various conformational exchange rates (i.e., off- and on-rates, as well as the hinge-bending motion rates). The enzyme on- and off-rates could be obtained by independent methods. Next, flags are set to include internal motions for methyl groups and aromatic rings. It is assumed that the internal rotation correlation time for the methyl groups is much shorter than the overall rotational correlation time for the ligand. The intramethyl proton-proton relaxation is calculated using the appropriate spectral density function. For dipolar contacts of methyls with external protons a simplified $<1/r^3>_{av}$ calculation is used. For aromatic rings, it is assumed that the ring-flip correlation times are are much longer than the rotational correlation times, but much shorter than the cross relaxation times; an $<1/r^6>_{av}$ method is used to account for modulation of internuclear distances. The third stage involves creation of generalized rate matrices for relaxation (E) and kinetics (K), based on the model under consideration. Next, the dynamic matrix D is created, symmetrized and diagonalized using QL or QR Jacobi method. In the prefinal stage, a file consisting of desired peak intensities (cross peaks including exchange-mediated peaks, diagonal peaks, or sums of appropriate sets of peaks in the case of exchange fast on the chemical shift scale) is read to print the intensities and compare them to experimental values. This comparison involves a calculation of NOE R-Factors.

For a given set of total enzyme and ligand concentrations, and equilibrium constants, the program also computes the kon rates for the ligand and the enzyme in the dynamical model under consideration, as well as the concentrations of the different species under equilibrium. These concentrations are used to define the concentration matrix C, and the symmetrization matrix S. (in the current version concentrations are normalized with respect to one of the species, and reexpressed in terms of ratios of appropriate rates).

For a 2-state model, with $K_{eq}=k_1/k_{-1}$, the concentrations are given by $[E]=\{-b+SQRT[b^2-4c]\}/2$ $[L]=[L_T]-[E_T]+[E]$ $[L']=[E']=[E'L']=[E_T]-[E]$ where $b=\{(1/K_{eq})-[E_T]+[L_T]\}$ and $c=-[E_T]/K_{eq}$ Similarly, for a 3-state model (39), with $K^{(1)}_{eq}=k_1/k_{-1}=[EL]/[E][L]$ and $K^{(2)}_{eq}=k_2/k_{-2}=[E''L'']/[E'L']$, the concentrations are given by $[E]=\{-B+SQRT[B^2-4C]\}/2$ $[L]=[L_T]-[E_T]+[E]$ $[E'L']=[E']=[L']=K^{(1)}_{eq}[E][L]$ $[E''L'']=[E'']=[L'']=K^{(2)}_{eq}[E'L']$ where $B=\{1+(1+K^{(2)}_{eq})K^{(1)}_{eq}([L_T]-[E_T])\}/\{(1+K^{(2)}_{eq})K^{(1)}_{eq}\}$ and $C=-[E_T]/\{(1+K^{(2)}_{eq})K^{(1)}_{eq}\}$ The hypothetical model used for simulating ligand-protein cross relaxation as well as hinge-bending motions is based on the published x-ray structure of thermolysin with an irreversible-inhibitor bound in the active site. Since the primary interest is to simulate the tr-NOESY results for different forward and reverse rates, the covalent bond between the inhibitor and the enzyme is replaced with a hydrogen to allow for reversible binding of this hypothetical inhibotor in the models. The orientation of the putative enzyme flap is also drastically changed in order to better test effects of protein-mediated spin diffusion as discussed below. Only the active-site residues (a total of nine residues, consisting of N-112, A-113, F-114, W-115, N-116, E-143, H-146, R-203, and H-231) of thermolysin were included in our models to expedite calculations. It was assumed that Ala-113 of thermolysin is farther from the inhibitor in the open state, and is closer in the closed state, as shown in FIG. 2.

Example 1

Two-State Example

To demonstrate the basic program algorithm, the behaviour of the NOESY cross peak intensity connecting the two geminal protons $b_1$–$b_2$ (separated by a fixed distance of 1.8 Å) in the inhibitor in FIG. 2, was studied. They will be referred to as A-X in the following. For notational purposes, assume that A and X refer to the free ligand protons (State 1 in FIG. 1) while A' and X' correspond to the ligand protons in the enzyme-bound form. To approximate the thermolysin-inhibitor interaction to a 2-state situation, it was assumed that the open state of the enzyme is non-existent and that the inhibitor goes to the closed-state instantaneously upon complexation. This model may be considered as a limiting situation of a three-state model with the open state present only as a transient with negligible population. A correlation time $10^{-11}$ s, somewhat shorter than normal, was deliberately assumed for the free ligand. For the bound form, a value of $10^{-8}$ s was chosen. For methyl group internal rotation correlation time, a value of $10^{13}$ s was chosen both for free and bound states. FIGS. 5A, 5B, 5C and 5D, shows the direct NOESY cross peak intensities I(AX) and I(A'X'), as well as the two exchange-mediated cross-peak intensities I(AX') and I(A'X) (11,12). They were computed as a function of the off-rate and the mixing time. These figures show dramatic effect of the off-rates on cross peak intensities. Addition of intensities in the four figures will give the total intensity for the situation when conformational exchange is fast on the chemical shift scale.

(a) Effect of Ligand/Enzyme ratio on the transferred NOESY

Figure 6:
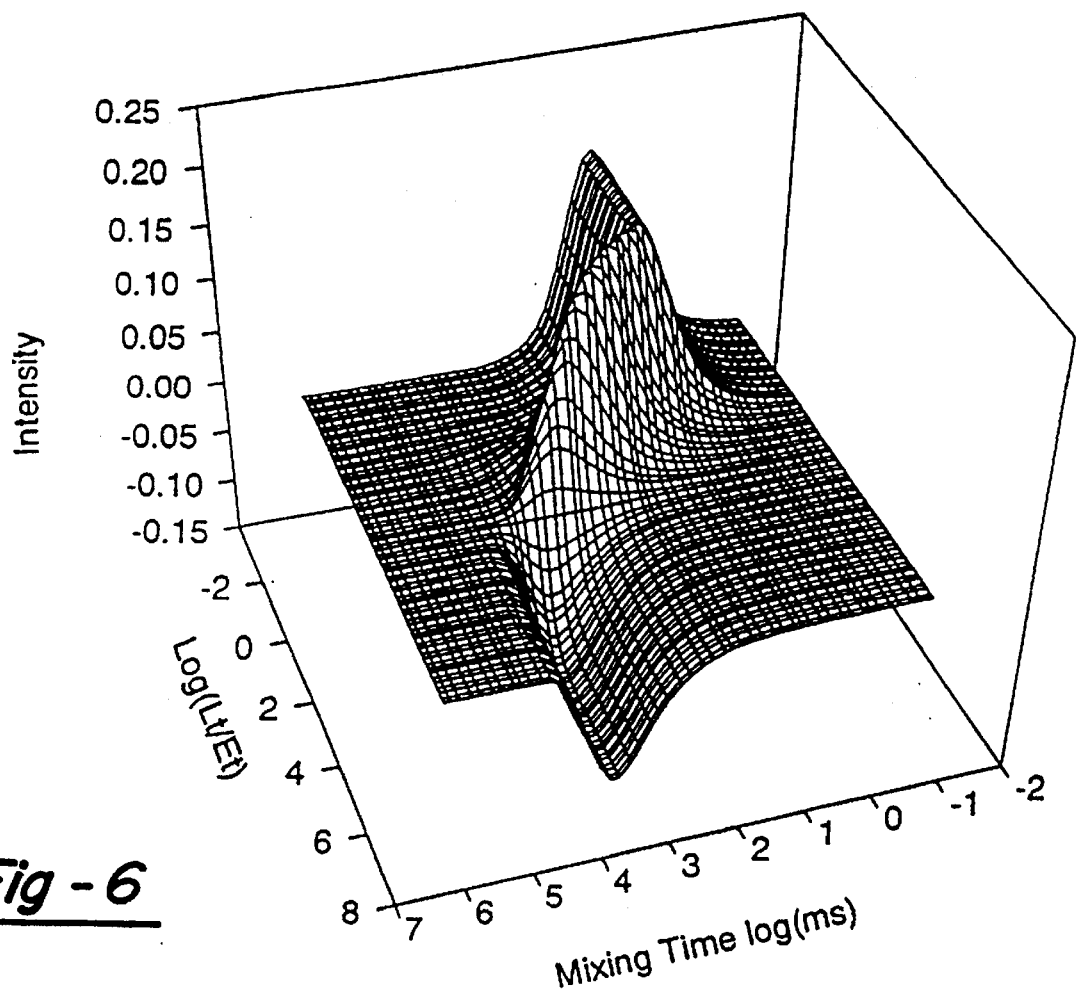
FIG. 6 is a graphical representation showing the effect of varying $[L_T]/[E_T]$ ratio on the transferred NOESY for the b1–b2 protons in a 2-state model (under fast exchange). The $[L_T]$ value was fixed at 0.01 M, and $[E_T]$ varied. Other parameters are same as in the previous figure. Notice that the intensity-maximum shifts toward small mixing times as $[L_T/E_T]$ is decreased, and the shift stops near the value 1. For $[L_T/E_T] \leq 1$, the intensity reaches a constant value since all the ligand is bound. Intensities were normalized to the total ligand diagonal peak intensity at zero mixing time.

As a separate question, the effect of varying the ligand/enzyme ratio on the transferred NOESY intensities was also computed. FIG. 6 shows the effect of varying $L_T/E_T$ ratio on the $b_1$–$b_2$ total transferred NOESY (i.e., sum of two direct plus two exchange-mediated peak intensities). It is clear that maximal effects are obtained when the $L_T/E_T$ is smaller (i.e. closer to 1 in FIG. 6), but nevertheless are retained up to about $L_T/E_T \approx 75$ for the particular case of thermolysin-ligand system chosen in the current study. For $L_T/E_T \geq 100$, the transferred NOESY technique as a method is not as dramatic since one has to contend with small changes in the magnitudes of the negative intensities of the ligand alone as opposed to a reversal in signs of the NOESY intensities for smaller ratios. For larger enzymes, the range of useful transferred NOESY regime increases, as is known in the art.

(b) Role of Ligand-Protein Intermolecular Cross Relaxation

Figure 7:
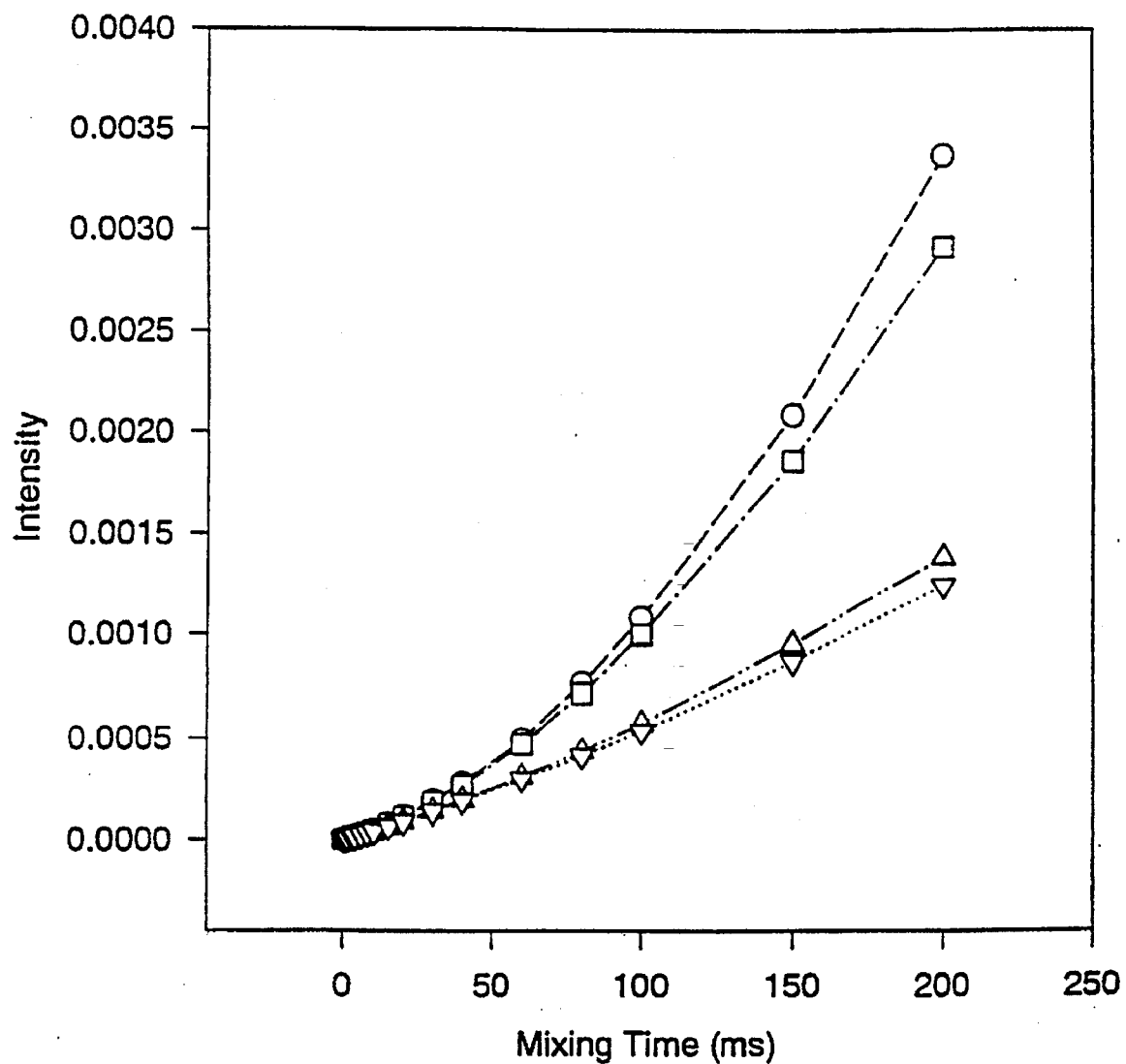
FIG. 7 is a plot showing the influence of ligand-enzyme intermolecular cross relaxation on the NOESY intensities of ligand protons in a 2-state model of thermolysin-inhibitor interaction. The total intensity (i.e., sum of two direct cross and two exchange mediated cross peaks) is calculated for the m1—m2 NOESY contact as a function of mixing time. The off-rate, $k_{21}$, was set at 1.44×$10^5$ $s^{-1}$. Four plots are shown: A. (- - - -) all protons on the enzyme included; B. ( -. -. -. -. only the αH and NH protons of Ala-113 excluded; C. (-.. -.. -.. -..) only the methyl protons of Ala-113 excluded; D. (...........the αH, NH and methyl protons of Ala-113 excluded. Only the initial build up region up to 200 ms is shown in the figure. Intensities normalized as in FIG. 5.

To examine the influence of ligand-protein dipolar cross relaxation in modulating the intensities in the ligand proton NOESY spectrum, the m1–m2 total NOESY intensity (two direct cross peaks and two exchange mediated cross peaks) between the two ligand methyl groups as a function of the off-rate was also computed. The distance between the two methyl groups is 6.8 Å. In FIG. 7, the NOESY intensities for short mixing times in the region 0 to 200 ms that include initial rate regime are plotted for an off rate of $k_{21}=144\times10^3$ sec$^{-1}$ for four circumstances: (a) all protons on Ala-113 on the enzyme are retained (see FIG. 2); (b) the methyl protons of Ala-113 are excluded from the pdb file; (c) the alanine αH and NH protons of Ala-113 are excluded; and (d) all the protons on Ala-113 are excluded. Note that in all these computations it is assumed that the ligand does not change its conformation on binding to thermolysin. The influence of enzyme-mediated cross-relaxation is dramatically evident from this figure, and it has the effect of substantially enhancing the NOESY intensity even though the ligand conformation has not changed. Notice that in this example, the initial lag period that is often used to identify protein-mediated spin diffusion, is somewhat poorly defined for the case where all the alanine protons were included. Further, the true initial slope period is confined to the first 25 ms of the mixing time only. For small mixing times, the NOESY spectrum often suffers from poor signal/noise ratio, making it difficult to get good estimates of the initial slopes. Under these conditions, one might be tempted to fit the data in the 0–200 ms mixing times range by an initial slope approximation to get estimates of intra-ligand distances. As is evident from FIG. 7, initial slope fitting of this data will lead to the misleading conclusion that the ligand in the bound form undergoes a conformational change that brings the two methyl groups closer, whereas there is no change. These calculations underscore the importance of properly incorporating the ligand-protein intermolecular cross-relaxation. The enzyme-mediated spin diffusion has more pronounced influence than the ligand-mediated spin diffusion, on the initial slopes of ligand NOESY buildup curves.

An examination of many published 1D tr-NOE spectra in literature clearly demonstrate large intensity changes in the background enzyme resonances presumably due to an intermolecular NOE in the complexed state when a "free" ligand resonance is saturated. Customarily, these intensity changes and the associated influence of ligand-enzyme cross relaxation, have been routinely neglected in many studies. Saturation of the protein proton resonance envelop (away from ligand resonances) would in effect uncouple the ligand and enzyme protons, and hence suppress the indirect pathways mediated by the enzyme. While this procedure will work fine for the relatively rigid type of situations where the saturation can be transferred through efficient spin diffusion, its universal applicability may be limited if the protein segmental motions render the spin diffusion inefficient. In this case, it is necessary to identify the active site proton resonances and saturate them directly. A second problem arises if the life time of the bound ligand is comapable to the relaxation times, since now the bound ligand protons may also experience some degree of saturation transfer from the protein protons that are being irradiated. Hence, it may be necessary to explicitly incorporate the ligand-protein cross-relaxation effects in a total relaxation analysis.

(c) Ligand-Enzyme Intermolecular NOESY Intensity as a Function of Off-rate

Figure 8:
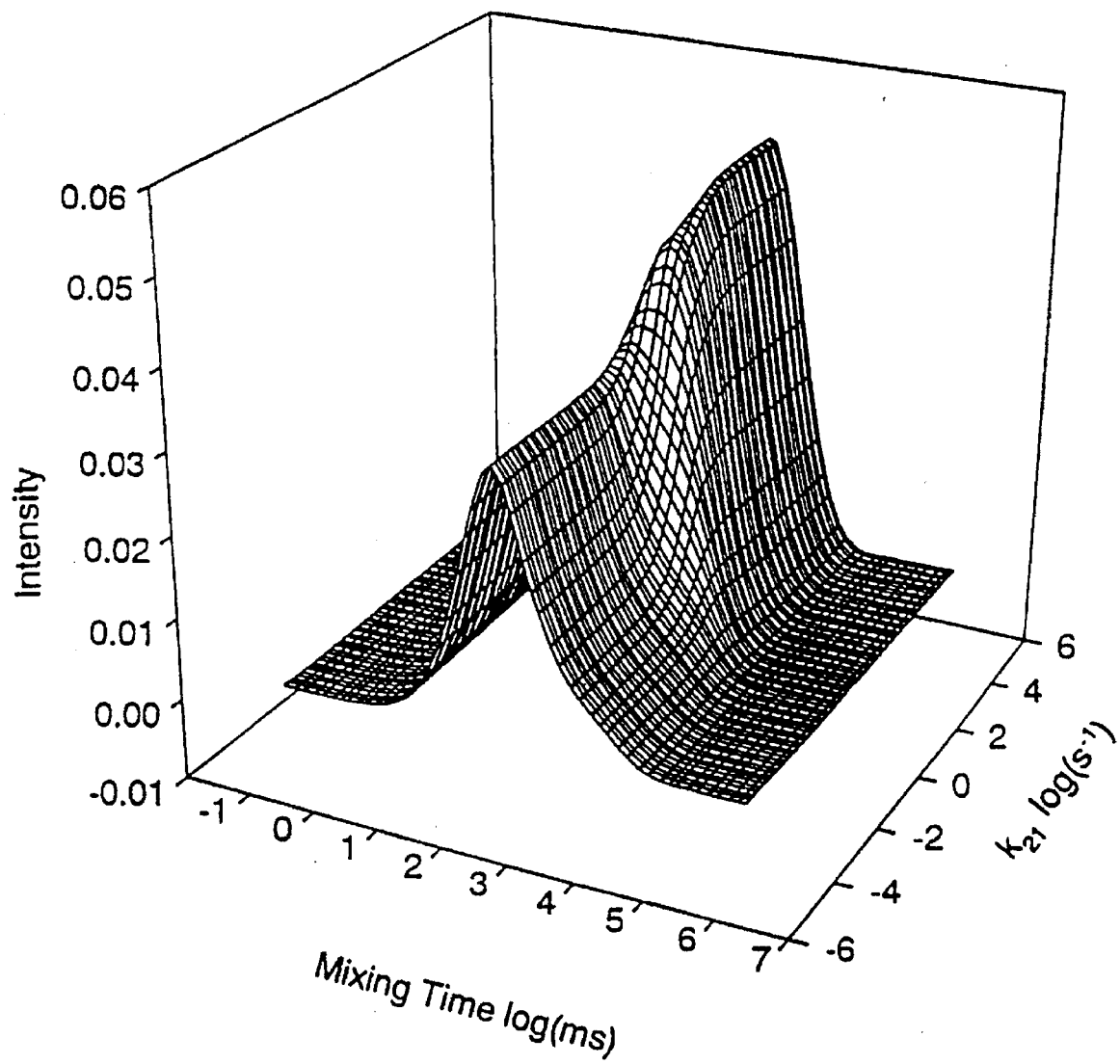
FIG. 8 is a graphical representation for intermolecular NOESY contact between the m1 methyl protons on the ligand and the Ala-113 methyl protons on the enzyme, in the 2-state model, as a function of mixing time and off-rate ($k_{21}$). The plotted intensity is a sum of four separate contributions (free ligand-free enzyme, bound ligand-bound enzyme, free ligand-bound enzyme, and bound ligand-free enzyme intensities). Parameters are same as in FIG. 5.
Figure 9A:
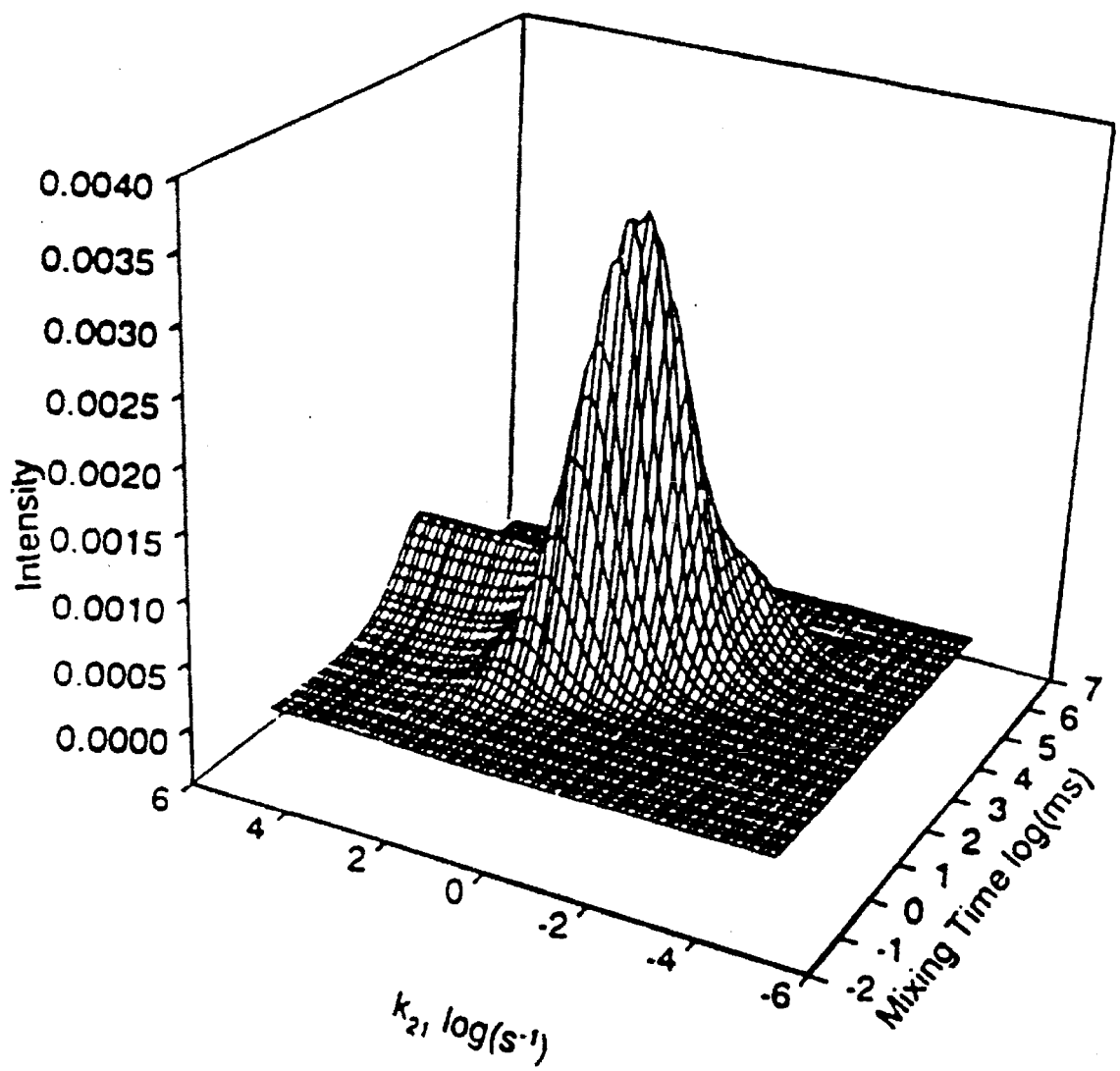
FIGS. 9(A)–9(D) is a graphical represenation of intermolecular NOESY contact between the m1 methyl group on the ligand and Ala-113 methyl group on the enzyme. The four separate contributions mentioned in FIG. 8 are shown. The free state is 1, and the bound state is 2. Notice that the two exchange-mediated peaks show differences (unlike the exchange-mediated peaks for intramolecular NOESY in FIG. 5).
Figure 9B:
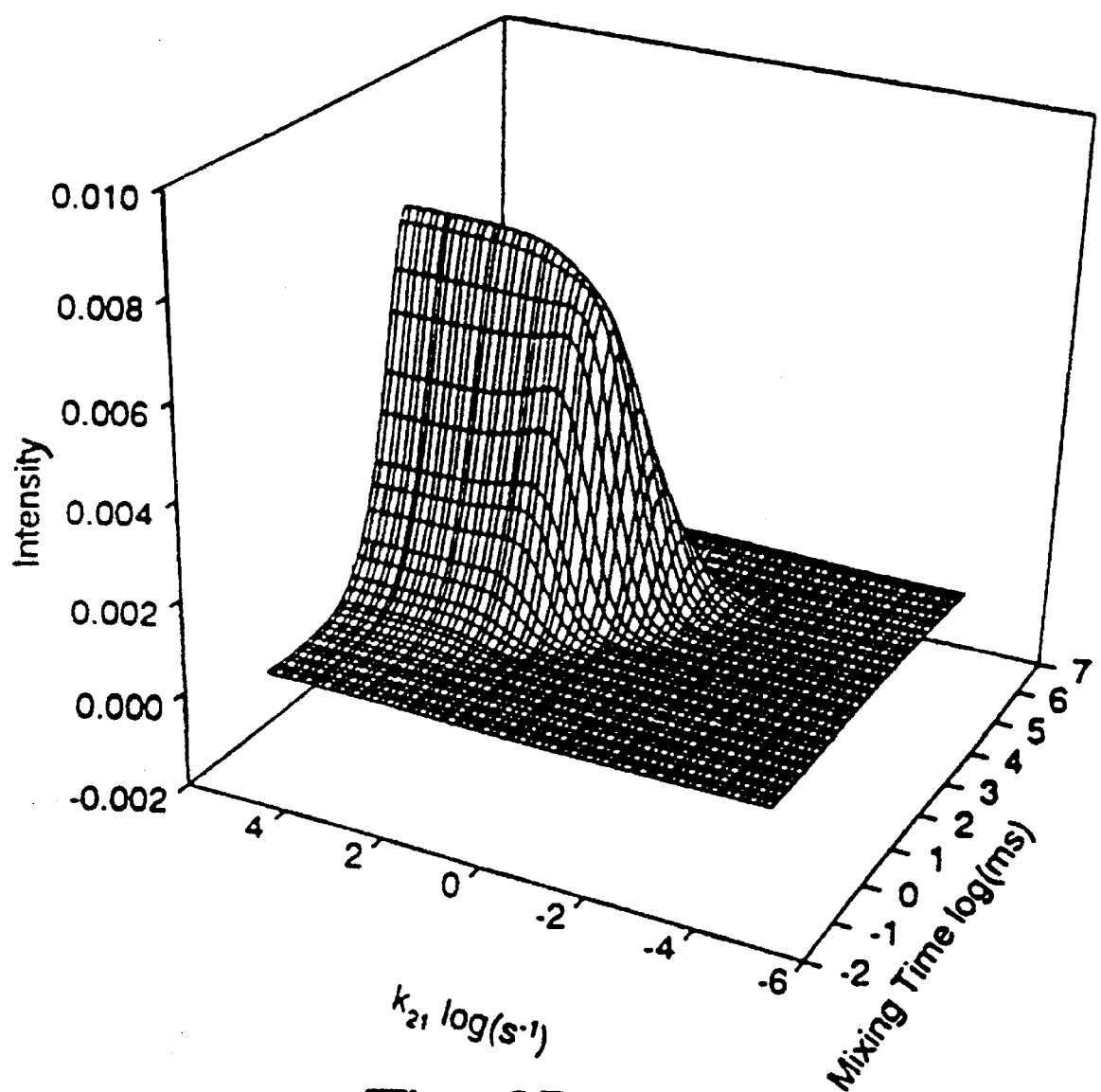
Figure 9C:
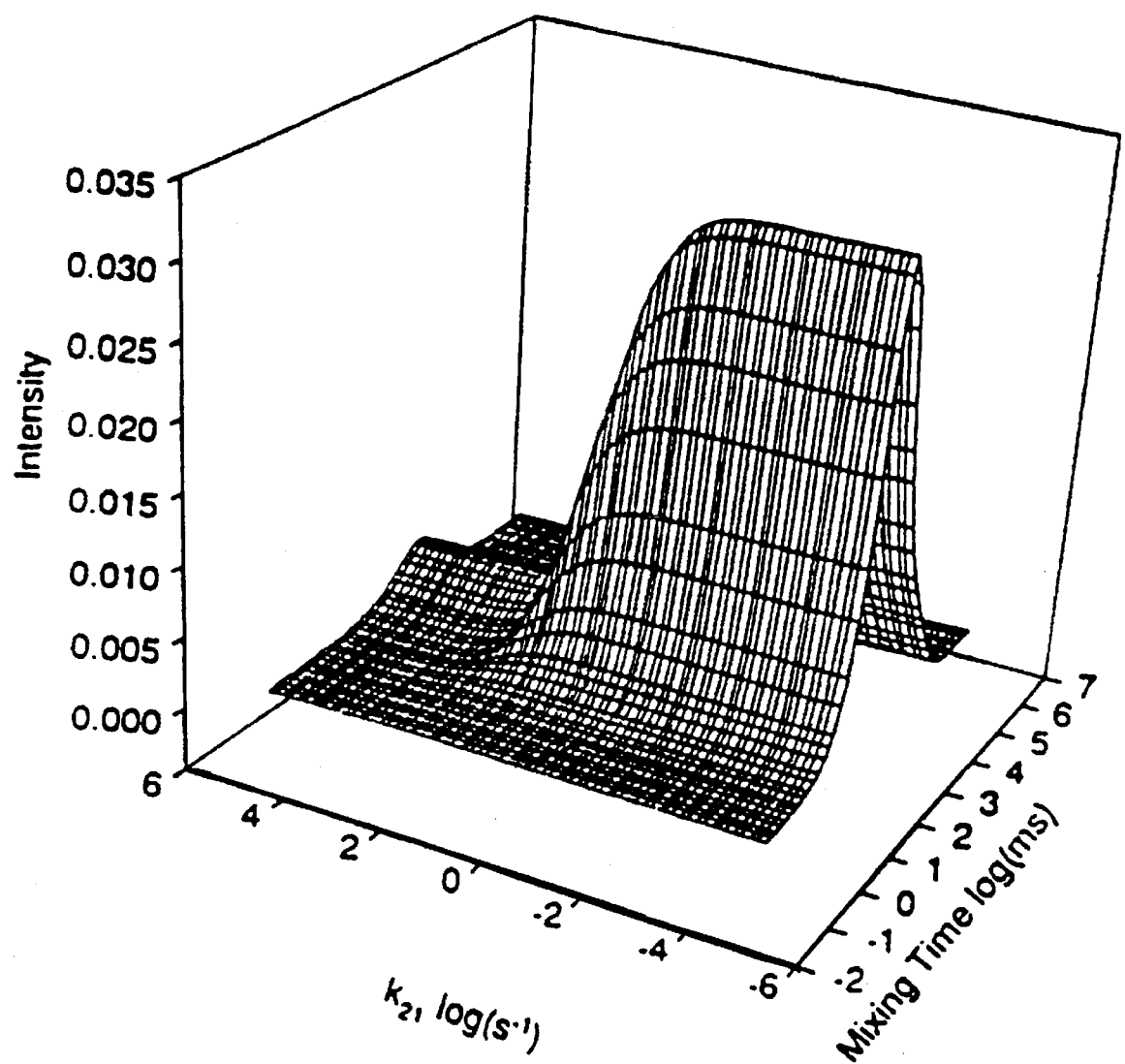
Figure 9D:
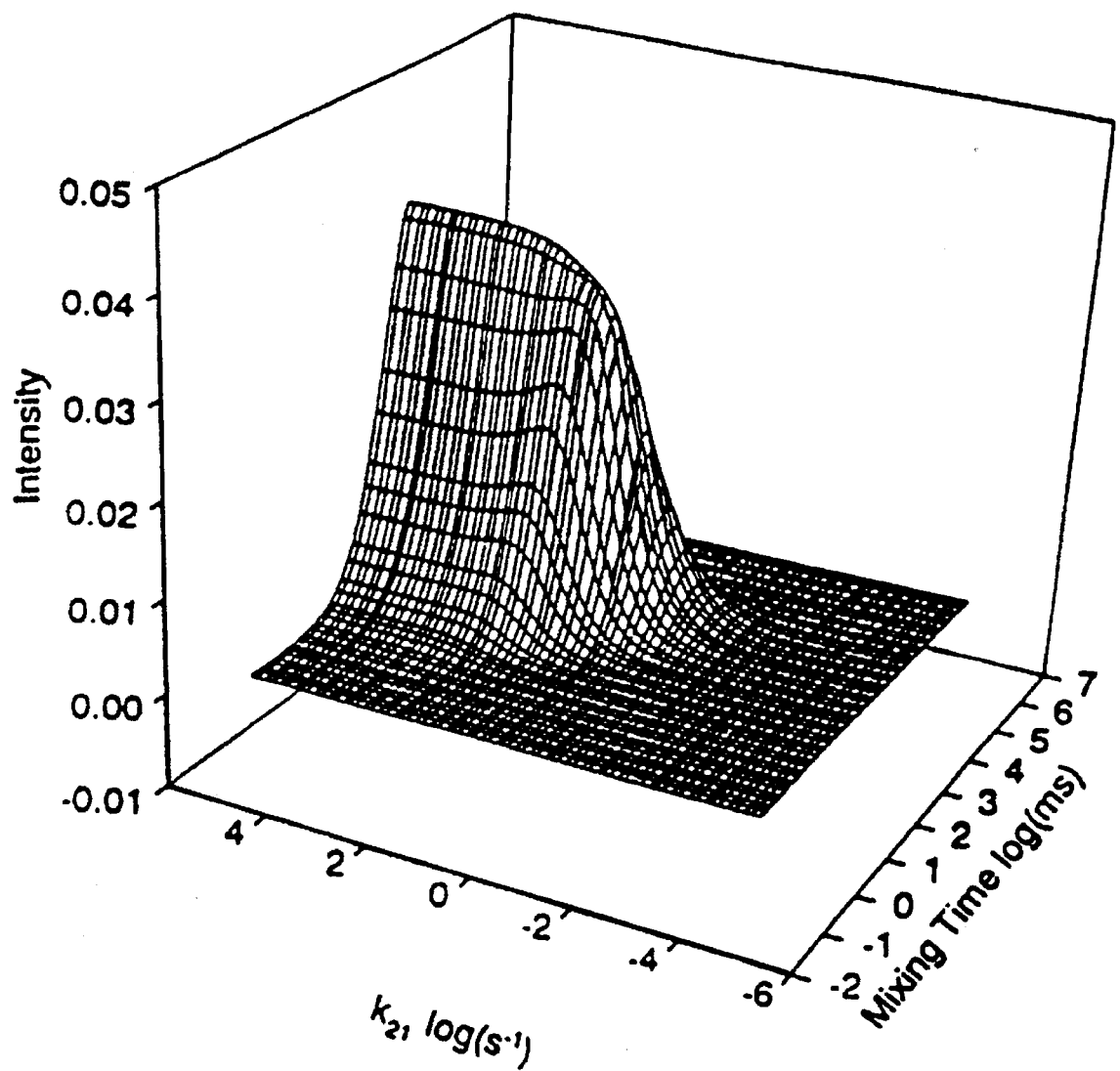

In FIG. 8 is shown a graphical representation of the computed intermolecular ligand-enzyme NOESY cross-peak intensity between ml methyl group of the ligand and the alanine-113 methyl group of the enzyme as a function of the off-rate. This intensity is plotted as a sum of four separate intensities (free ligand-free enzyme; bound ligand-bound enzyme; free ligand -bound enzyme; and bound ligand-free enzyme). The four separate contributions, that would be observable if the exchange is slow on the chemical shift scale, are shown in FIG. 9 as a function of $k_{21}$ and mixing time. Note that for fast exchange rates, the free ligand-free enzyme cross peak develops intensity due to indirect pathways involving conformational exchange and cross-relaxation in the bound state (12). The substantial nature of intermolecular ligand-enzyme NOESY contact is obvious from these figures. Similar conclusions have also reached by others. These results suggest that it may be feasible to model intermolecular contacts between two interacting species even when they are not tightly bound (i.e. with $K_d \sim 10^{-5}$–$10^{-7}$ M range), provided one keeps track of the chemical shifts of the two interacting species. Intermolecular contacts under these conditions have been observed between a peptide antigen and different antibody fragments as reported in the literature. In these studies, the broad resonances of the antibody were suppressed to identify the intermolecular ligand-protein contacts.

FIGS. 9A–9D is a graphical representation of intermolecular NOESY contact between the m1 methyl) group on the ligand and Ala-113 methyl group on the enzyme. The four separate contributions mentioned in FIG. 8 are shown. The free state is 1, and the bound state is 2. Notice that the two exchange-mediated peaks show differences (unlike the exchange-mediated peaks for intramolecular NOESY in FIG. 5).

Example 2

Transferred NOESY on Systems with More Than Two States:
(Effect of Motions in the Protein-Ligand Complex on the Transferred NOESY)

In this section, a more interesting situation is examined where, upon inhibitor binding, the enzyme undergoes a conformational transition from an "open state" to a "closed state" in which the inhibitor securely occupies the active site. Assumed is the reasonable assumption in this model that the only way the inhibitor could be released from the closed state is by passing through the open state. The relevant scheme is shown in FIG. 3. The conformations of the ligand and the enzyme could be different in all three states.

(a) A Simplified Example

First, to demonstrate the relative influence of both $k_{21}$ and $k_{23}$ on the tr-NOESY, the example utilized is of a ligand with two protons (AX) separated by a distance of 5.5 Å, and a rotational correlation time of $10^{-11}$ s. In the open state of the complex, it was assumed that there is no additional dipolar interaction, but now the ligand tumbles slowly with the correlation time of the enzyme ($10^{-8}$ s). In the closed state, a proton (M) from the enzyme approaches the A and X protons on the ligand with equal distances of 2.75 Å. Thus, in this model, the ligand-enzyme cross-relaxation takes place only in the closed state. A uniform leakage factor of 0.2 $\sec^{-1}$ was included in all three states.

Figure 10:
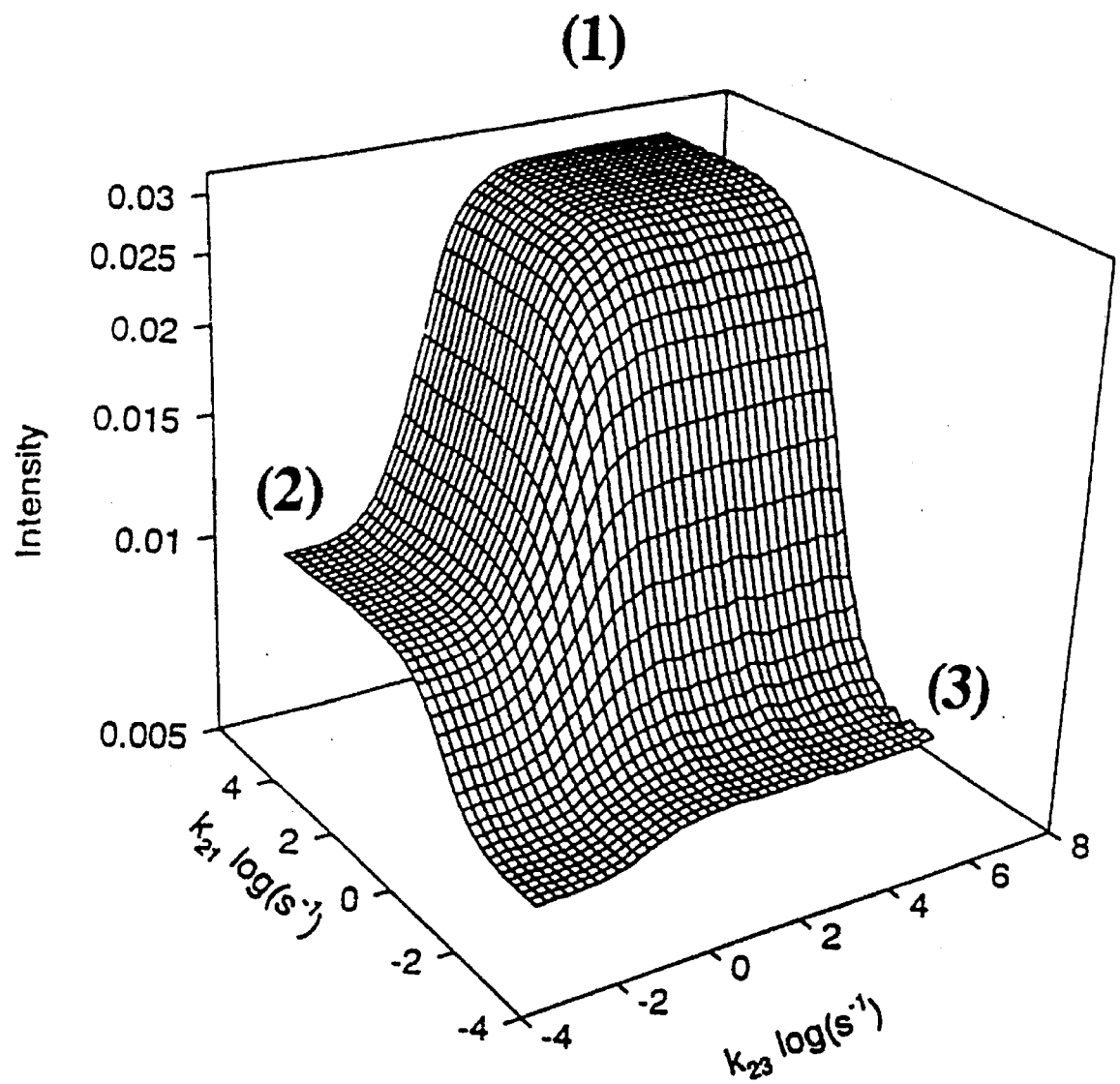
FIG. 10 is a graphical representation of transferred NOESY on off-rate ($k_{21}$) and hinge-bending rate ($k_{23}$) for a 3-state model with the AX spin system on the ligand, and a single proton (M) on the enzyme. The AX distance is fixed at 5.5 Å. In the open state of the enzyme, the ligand does not sense the enzyme proton M. In the closed state, however, the M proton is located equidistant (2.75 Å) to each of the ligand protons. The total NOESY intensity for all three states (sum of three direct and six exchange-mediated peaks) is shown. The mixing time is 4 s. The relative ligand concentrations in the free, open and closed states are 95%, 2.5%, and 2.5%, respectively. A leakage factor of 0.2 $sec^{-1}$ was introduced for all the states. Remaining parameters correspond to those used in FIG. 5. The figure shows three distinct plateau regions in the intensity associated with conformational averaging. Region (1) corresponds to $R_1P_1+R_2P_2+R_3P_3$ as in Eq.[30]. Region (2) corresponds to $R_1P'_1+R_2P'_2$ as in Eq. [36]. Region (3) is governed by $R_2P'_2+R_3P'_3$ as in Eq.[41]. A fouth plateau (for very small $k_{21}$ and $k_{23}$) corresponds to the trivial case of no conformational exchange.

FIG. 10 shows the results for a mixing time of 4 sec. For a given $k_{23}$ value, the tr-NOESY increases as the off-rate increases. The maximum value of tr-NOESY for large off-rates increases with increasing hinge-bending rates since the ligand-enzyme cross relaxation in the closed states is now making increasing contributions (see Eq.[37]). For example, for $k_{21}=10^4$, the tr-NOESY is 0.1 for $k_{23}=10^{-1}$ $s^{-1}$, and 0.45 for $k_{23}=10^5$. Recent measurements using atomic force microscopy have suggested that, in the presence of a substrate, lysozyme may experience motions on a 50 ms time scale. Such slow motions correspond to $k_{23} \approx 20$ in FIG. 10 where the maximum value of tr-NOESY is substantially smaller than the one expected for faster values of $k_{23}$. The following conclusions can be drawn from the figure: (1) If the protein motions ($k_{23}$ and $k_{32}$) are very slow, the so called bound conformation of the ligand only reflects the open state of the enzyme that does not necessarily reflect the active site configuration; thus any structure-based inhibitor design efforts will not be much meaningful. (2) If the protein motion is comparable to or faster than the ligand-protein cross relaxation, and is neglected during the course of analysis, it is tempting to propose a conformational change for the ligand that brings the two protons closer in the complexed form, to account for the large tr-NOESY values, whereas there may not be any change, as in this example. Even if an attempt is made to incorporate the ligand-protein cross-relaxation in analysing the tr-NOESY data using a 2-state model, the analysis will not be of much meaning since the open state may be present in significant fractional populations. An examination of FIG. 10 shows two plateau regions for large off-rates (i.e., $k_{21}>10^3$). One is located in the very slow hinge-bending rate region ($k_{23} \leq 10^{-1}$) where the effective relaxation rate is given by $R_1P'+R_1P_2$, (Eq.[36]), and the second one is located in the fast hinge-bending region ($k_{23}>10^3$) where the effective generalized relaxation rate is given by $R_1P_1+R_2P_2+R_3P_3$ (Eq.[30]). A third plateau, described by $R_2P_2+R_3P_3$, (Eq.[41]), is seen for very slow off-rates ($k_{21}$) and large $k_{23}$ rates.

(b) Hinge-Bending Motions in a Thermolysin-Inhibitor Complex

Figure 11:
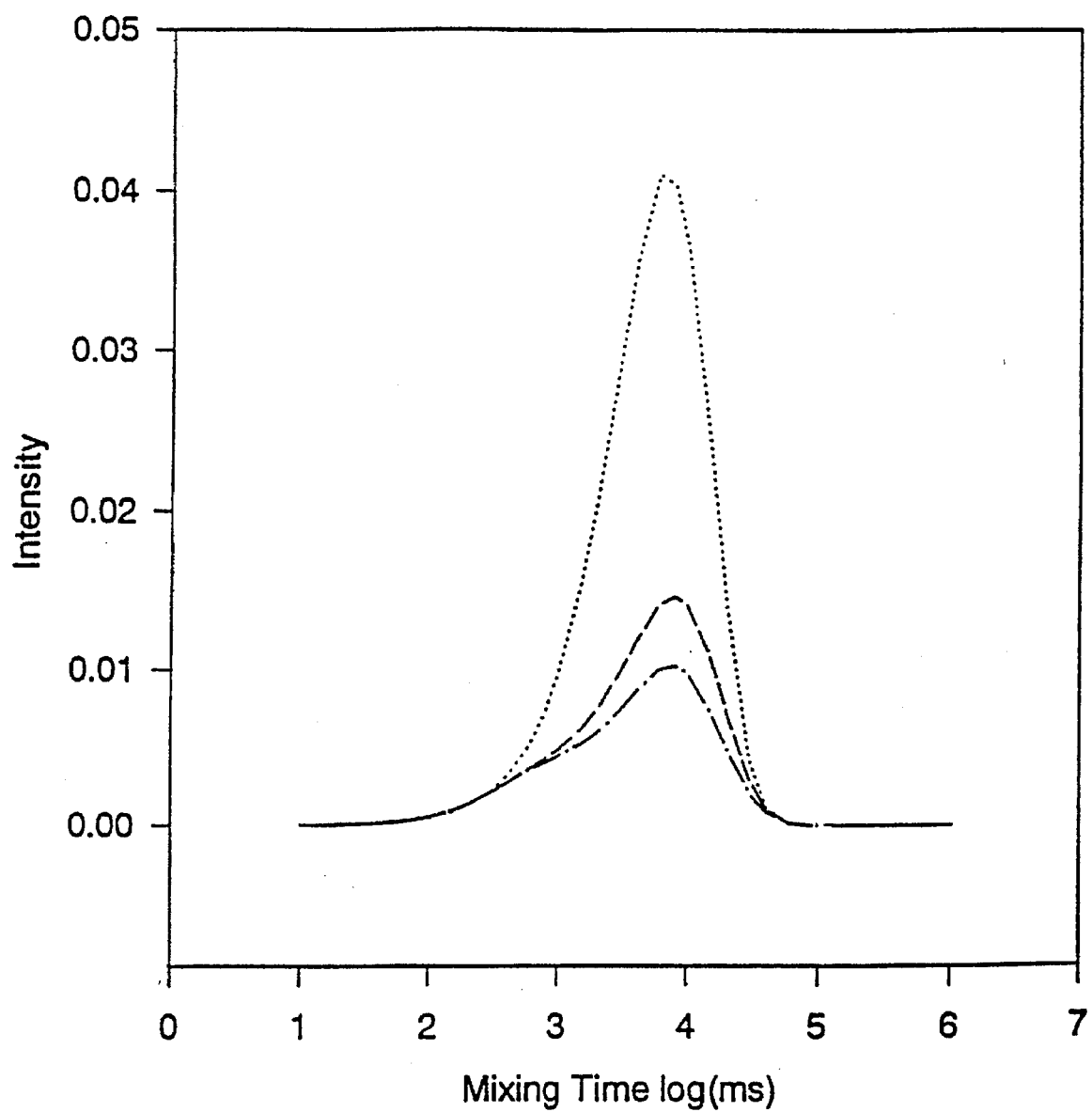
FIG. 11 is a plot representing transferred NOESY intensity of m1–m2 cross peak for the thermolysin-inhibitor complex for the case where the hinge-bending motions are comparable to relaxation rates. The enzyme-off rates are considered to be much faster. The intensities are shown for three cases of hinge-bending rates (bottom to top), $k_{23}$=(1/20) R', R' and 20R', where R'(=0.30 $s^{-1}$) is the cross relaxation rate between Ala-113 and ml methyls in the closed state.

A more realistic simulation of tr-NOESY on a 3-state system (FIG. 3) was done using the thermolysin-inhibitor model (FIG. 2), with modifications as described earlier. The ratio of $[L_T]/[E_T]$ was assumed to be 20. Further, the relative values of of ligand concentrations $[L_1]:[L_2]:[L_3]$ in the three states was assumed to be 95:2.5:2.5. $K^{(1)}_{eq}$ was taken as 5546.45 $M^{-1}$. $K^{(2)}_{eq}$ was taken as 1 (i.e., the two bound states are equally populated). In FIG. 11, is shown the time evolution of transferred NOESY intensity for the $m_1$–$m_2$ methyl groups on the inhibitor. The intensities were computed for $k_{21}=10^4$ $s^{-1}$, and for different values of $k_{23}$ in comparison with the cross relaxation rate $R_{Am1}$ (0.3 $s^{-1}$) in the closed state, where A refers to the alanine methyl group on the enzyme, and m1 refers to the methyl group on the ligand. The effective $<1/r^3>$ averaged distance between the protons in these two methyl groups corresponds to 6.8 Å. In the closed state, Ala-113 is closer to m1 and m2 groups, and becomes an effective conduit for magnetization transfer. In this model, the hinge-bending rate is much slower than the enzyme off-rate. The total m1–m2 NOESY intensity is calculated (involving all three states). In practice, for such slow motions, it is reasonable to assume that the closed state is in slow exchange on the chemical shift scale, while the free and open states are in fast exchange on the chemical shift scale.

For $k_{23}=(1/20, 1$ and $20)R_{Am1}$, the plots show that as the hinge-bending rate increases, there is also a dramatic increase in the NOESY intensity since there is an increasing contribution from the $R_3$ matrix corresponding to the closed state (see Eq. [34]). For slower bending rates, the intensity is dominated primarily by the weighted average rate matrix $R_1P'_1+R_2P'_2$. Thus, for slow hinge-bending motions, the transferred NOESY technique may in some instances fail to provide information about the active site in the closed state of the enzyme.

If the hinge-bending rate is much faster than the relaxation rates in the two bound states as well, then the NOESY intensities are governed by a an effective generalized rate matrix $R_1P_1+R_2P_2+R_3P_3$, which is a weighted average of the generalized rate matrices for each of the states (Eq.[30]). In this instance, of course, the $m_1$–$m_2$ NOESY intensity will be substantially stronger than the previous case where the hinge-bending motion is slower.

While the illustrative embodiments of the invention have been described with particularity, it will be understood that various other modifications will be apparent to and can be readily made by those skilled in the art without departing from the spirit and scope of the invention. Accordingly, it is not intended that the scope of the claims appended hereto be limited to the examples and descriptions set forth herein but rather that the claims be construed as encompassing all the features of patentable novelty which reside in the present invention, including all features which would be treated as equivalents thereof by those skilled the art to which this invention pertains.

We claim:

1. A method of using a modelling computer to determine two-dimensional nuclear- or rotating frame-Overhauser effect spectroscopy intensities for a ligand-enzyme system having flexible active sites, wherein the ligand-enzyme system has at least two conformational states, the method comprising:

(a) inputting data into a modeling computer, wherein the data relates to coordinates for each molecule on the enzyme and ligand, kinetic data, correlation times, and concentrations of ligand and enzyme;
   (b) creating a K matrix file containing a kinetic matrix of the kinetic data;
   (c) creating an R matrix file containing an R matrix derived from the correlation times and the coordinates;
   (d) creating a D matrix file containing a D matrix that is the sum of the K matrix and the R matrix;
   (e) modifying the D matrix file by symmetrizing the D matrix with a symmetrizing matrix $S_N$ followed by diagonalization, wherein $S_N$ is as follows:

$$S_N = \begin{matrix} [L_1]^{1/2} & & & & \\ & [E_1]^{1/2} & & & \\ & & [L_2]^{1/2} & & \\ & & & [E_2]^{1/2} & \\ & & & \ldots & \\ & & & & [L_N]^{1/2} \\ & & & & & [E_N]^{1/2} \end{matrix}$$

wherein N is the number of conformational states for the ligand and enzyme, with L and E representing ligand and enzyme states, respectively; and (f) determining the Overhauser effect spectroscopy intensifies from the symmetrized D matrix.

2. The method of claim 1 wherein the ligand-enzyme system has at least 3 conformational states.

3. The method of claim 1 wherein the coordinates input in step (a) are in protein data bank format.

4. The method of claim 3 wherein the ligand-enzyme system has at least 3 conformational states.

5. The method of claim 1 further comprising:

(g) determining accuracy of the method by comparing the intensities from step (f) with experimental intensity data.

6. The method of claim 5 wherein the ligand-enzyme system has at least 3 conformational states.

7. A method of using a modelling computer to determine two-dimensional nuclear- or rotating frame-Overhauser effect spectroscopy intensities for a first compound and second compound system having flexible active sites, wherein the system has at least two conformational states, the method comprising:

(a) inputting data into a modeling computer, wherein the data relates to coordinates for each molecule on the first compound and the second compound, kinetic data, correlation times, and concentrations of first compound and the second compound;
   (b) creating a K matrix file containing a kinetic matrix of the kinetic data;
   (c) creating an R matrix file containing an R matrix derived from the correlation times and the coordinates;
   (d) creating a D matrix file containing a D matrix that is the sum of the K matrix and the R matrix;
   (e) modifying the D matrix file by symmetrizing the D matrix with a symmetrizing matrix $S_N$, followed by diagonalization, wherein $S_N$ is as follows:

$$S_N = \begin{matrix} [FC_1]^{1/2} & & & & \\ & [SC_1]^{1/2} & & & \\ & & [FC_2]^{1/2} & & \\ & & & [SC_2]^{1/2} & \\ & & & \ldots & \\ & & & & [FC_N]^{1/2} \\ & & & & & [SC_N]^{1/2} \end{matrix}$$

wherein N is the number of conformational states for the first compound and the second compound, with FC and SC representing first compound and the second compound states, respectively; and (f) determining the Overhauser effect spectroscopy intensities from the symmetrized D matrix.

8. The method of claim 7 wherein the ligand-enzyme system has at least 3 conformational states.

9. The method of claim 7 wherein the coordinates input in step (a) are in protein data bank format.

10. The method of claim 9 wherein the ligand-enzyme system has at least 3 conformational states.

11. The method of claim 7 further comprising: (g) determining accuracy of the method by comparing the intensities from step (f) with experimental intensity data.

12. The method of claim 11 wherein the ligand-enzyme system has at least 3 conformational states.

13. An apparatus for determining two-dimensional nuclear- or rotating frame-Overhauser effect spectroscopy intensities for a first compound and second compound system having flexible active sites, wherein the first and second compound system has at least two conformational states, the apparatus comprising:

(a) a computer;
   (b) a data entry system for inputting data into the computer, wherein the data relates to coordinates for each molecule on the first and second compound and the enzyme, kinetic data, correlation times, and concentrations of the first compound and the second compound;
   (b) a matrix creation system for creating a K matrix file containing a kinetic matrix of the kinetic data, and for creating an R matrix file containing an R matrix derived from the correlation times and the coordinates, and for creating a D matrix file containing a D matrix that is the sum of the K matrix and the R matrix;
   (c) matrix modification system for modifying the D matrix file by symmetrizing the D matrix with a symmetrizing matrix $S_N$, followed by diagonalization, wherein $S_N$ is as follows:

$$S_N = \begin{matrix} [FC_1]^{1/2} & & & & \\ & [SC_1]^{1/2} & & & \\ & & [FC_2]^{1/2} & & \\ & & & [SC_2]^{1/2} & \\ & & & \ldots & \\ & & & & [FC_N]^{1/2} \\ & & & & & [SC_N]^{1/2} \end{matrix}$$

wherein N is the number of conformational states for the first compound and the second compound, with FC and SC representing first compound and the second compound states, respectively; and (d) a calculation system for determining the Overhauser effect spectroscopy intensities from the symmetrized D matrix.

14. The method of claim 13 wherein the first compound is a ligand and the second compound is an enzyme.

* * * * *

UNITED STATES PATENT AND TRADEMARK OFFICE
CERTIFICATE OF CORRECTION

PATENT NO. : 5,668,734
DATED : September 16, 1997
INVENTOR(S) : Nepalli Rama Krishna et al.

It is certified that error appears in the above-identified patent and that said Letters Patent is hereby corrected as shown below:

Column 5, line 7, insert --$[E_N]^{1/2}$-- under the last element in the formula, and to the right.

Figure 5A:
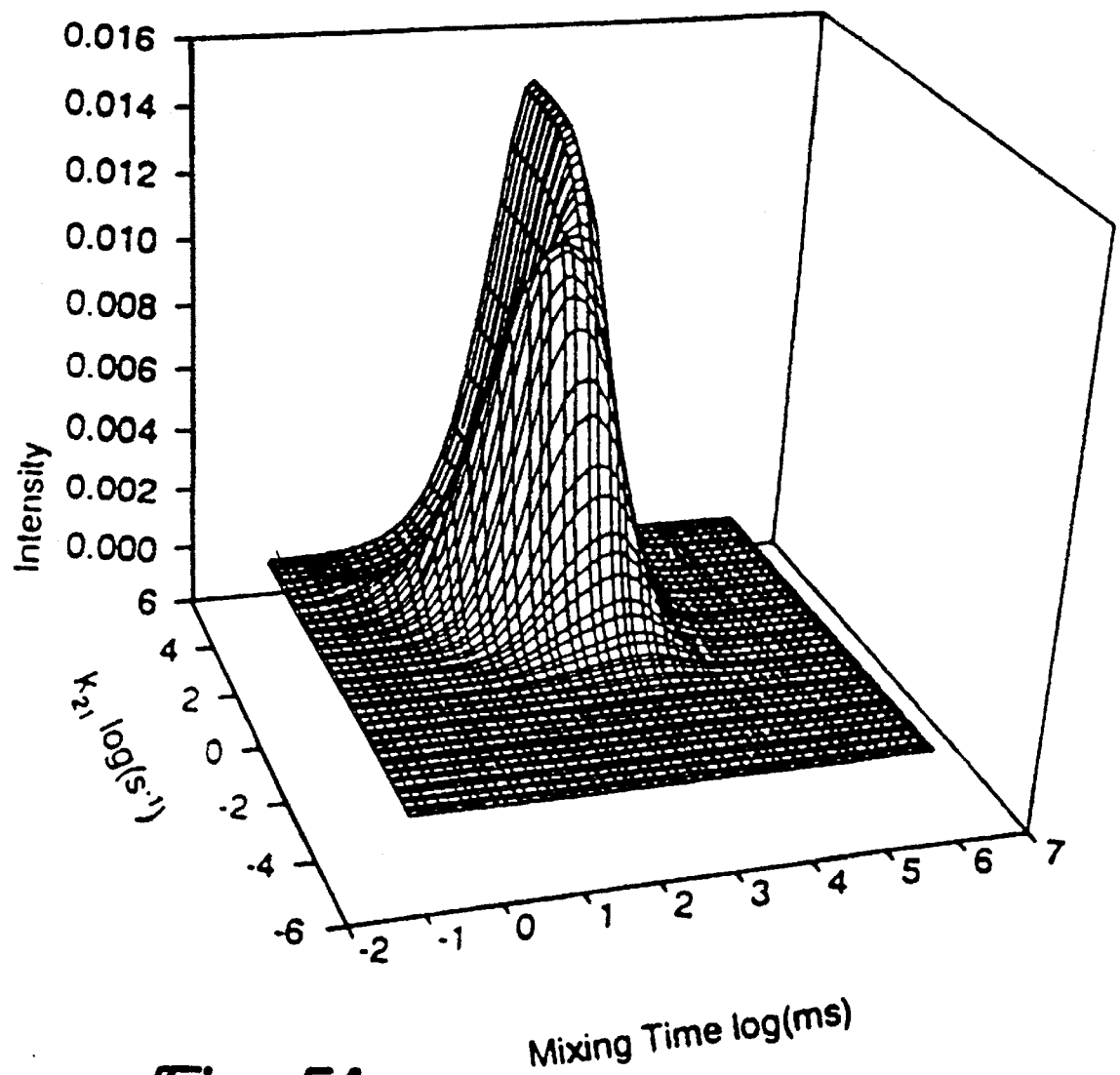
FIGS. 5(A)–5(D) are graphical representations of transferred NOESY data on a 2-state representation of thermolysin-inhibitor interaction (unbound and closed states). The NOESY intensity between the two geminal protons, b1–b2, is shown as a function of mixing time and the off-rate $k_{21}$. Four plots corresponding to the two direct cross-peaks (one in the free state and one in the bound state) as well as the two exchange-mediated cross peaks between free and bound states are shown. The inset at the center identifies the four cross-peaks. All cross-peak intensities were normalized with respect to the diagonal peak intensity of a single proton (b1) in the uncomplexed ligand at zero mixing time. The intensity when conformational exchange is fast on the chemical shift scale, is obtained by adding the intensities in the four plots. The parameters used in the simulation are: $[L_T]$=1 mM ; $[E_T]$=0.1 mM; τ(ligand)=$10^{-11}$ s ; τ(enzyme)=$10^{-8}$ s; $K^{(1)}_{eq}$=5546.45 $M^{-1}$; $k_1$=6.1×$10^7$ $s^{-1}$.
Figure 5B:
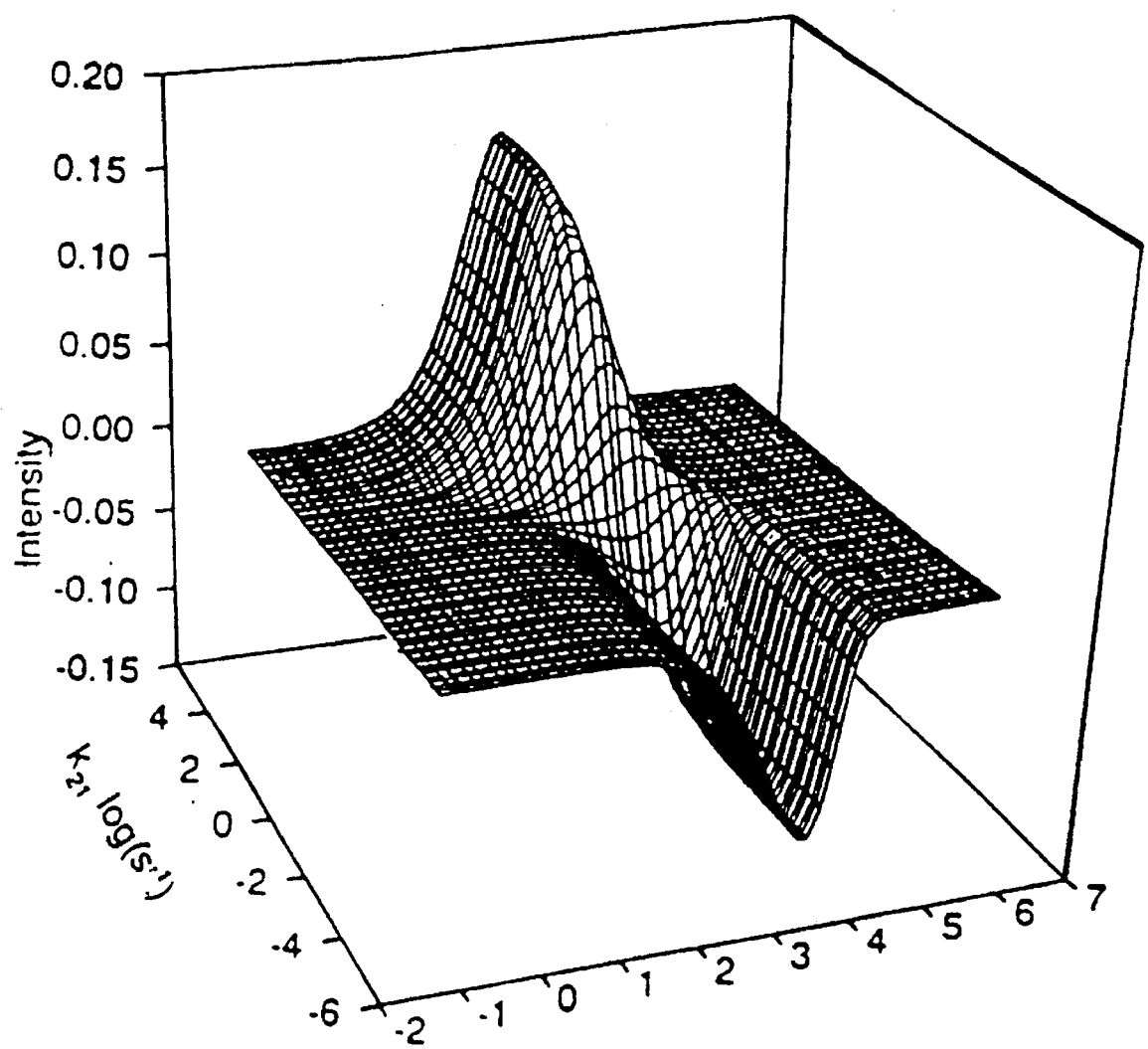
Figure 5C:
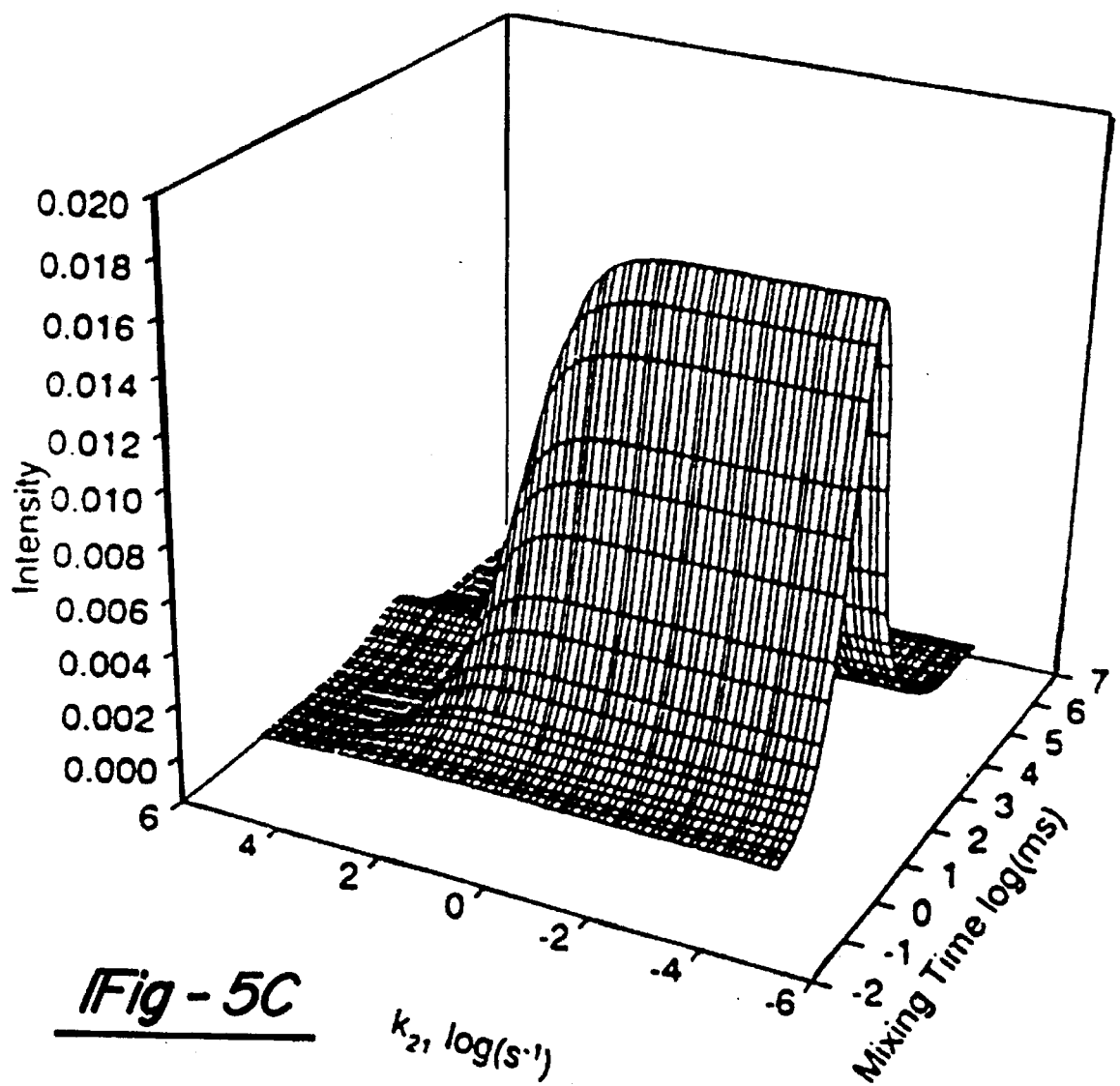
Figure 5D:
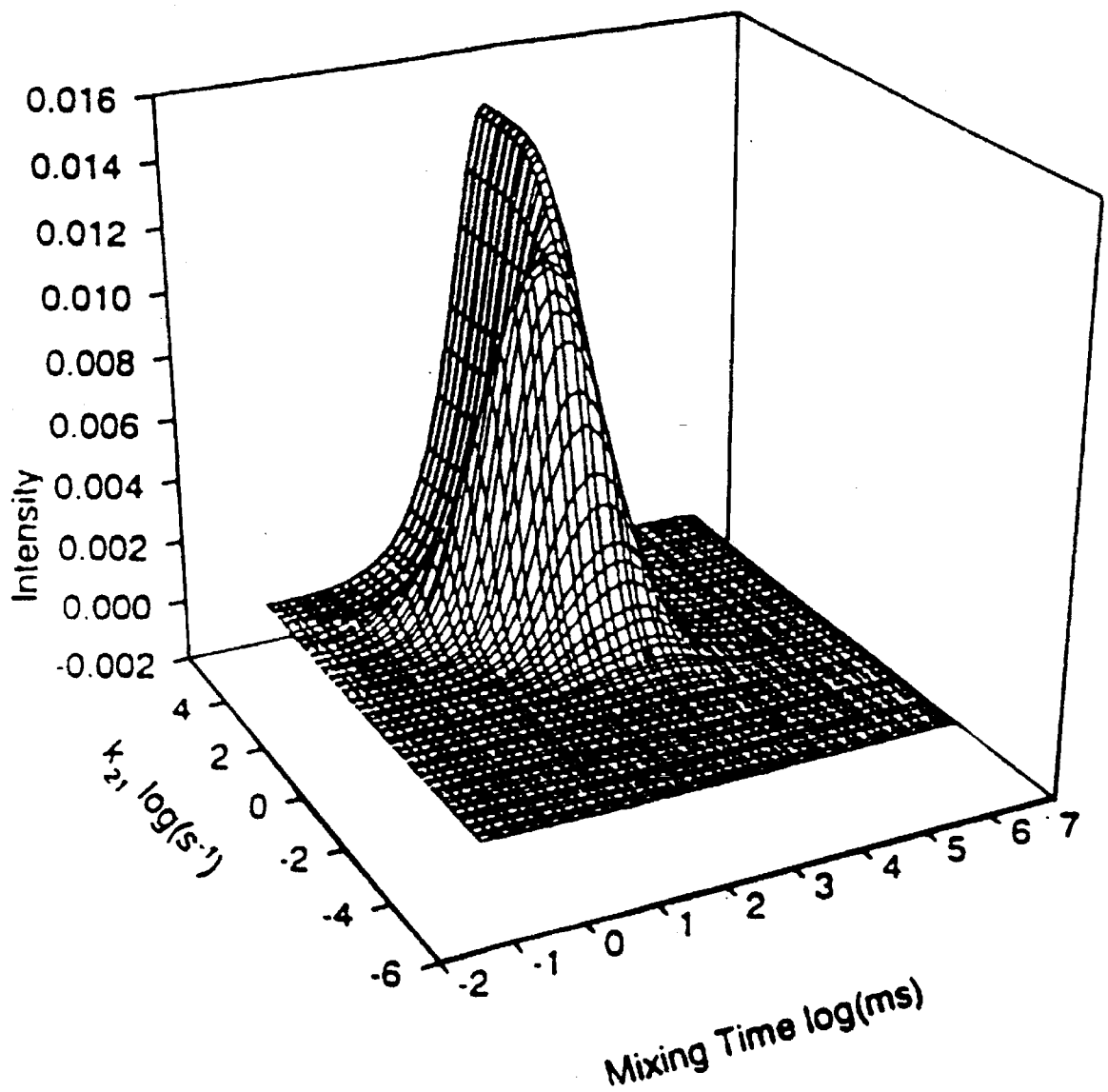
Figure 5E:
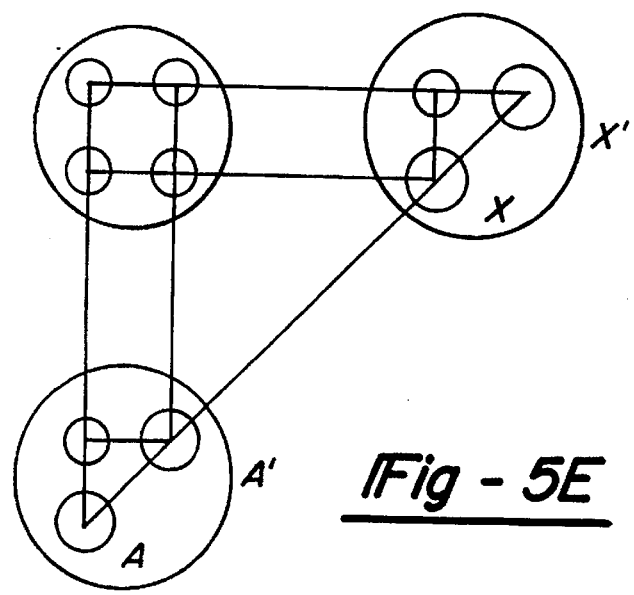

Column 6, line 26, insert after line 26 of same paragraph --Fig. 5E identifies the four crosspeaks. The crosspeaks are normalized with respect to the diagonal-peak intensity of a single proton ($b_1$), in the uncomplexed ligand at zero-mixing time.--

Signed and Sealed this

Twenty-eighth Day of April, 1998

Attest:

BRUCE LEHMAN

Attesting Officer

Commissioner of Patents and Trademarks